(12) United States Patent
Marukame et al.

(10) Patent No.: US 9,570,181 B2
(45) Date of Patent: Feb. 14, 2017

(54) MEMORY SYSTEM

(71) Applicant: KABUSHIKI KAISHA TOSHIBA, Tokyo (JP)

(72) Inventors: Takao Marukame, Tokyo (JP); Kazuya Matsuzawa, Kanagawa (JP); Yoshifumi Nishi, Kanagawa (JP); Jiezhi Chen, Kanagawa (JP); Yusuke Higashi, Kanagawa (JP); Yuuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/058,828

(22) Filed: Mar. 2, 2016

(65) Prior Publication Data

US 2016/0180938 A1 Jun. 23, 2016

Related U.S. Application Data

(63) Continuation of application No. PCT/JP2014/075760, filed on Sep. 19, 2014.

(30) Foreign Application Priority Data

Sep. 20, 2013 (JP) ................................ 2013-195789

(51) Int. Cl.
*G11C 16/14* (2006.01)
*G11C 16/10* (2006.01)
(Continued)

(52) U.S. Cl.
CPC ........... *G11C 16/10* (2013.01); *G11C 11/5628* (2013.01); *G11C 11/5642* (2013.01);
(Continued)

(58) Field of Classification Search
CPC ....................................................... G11C 16/08
USPC ..................................................... 365/185.13
See application file for complete search history.

(56) References Cited

U.S. PATENT DOCUMENTS 7,979,437 B2 7/2011 Shin
2004/0151012 A1 8/2004 Snider et al.
(Continued)

FOREIGN PATENT DOCUMENTS

JP 2001-167585 6/2001
JP 2005-209214 8/2005
(Continued)

OTHER PUBLICATIONS

International Search Report issued by the Japanese Patent Office in International Application No. PCT/JP2014/075760, mailed Dec. 9, 2014 (3 pages).
(Continued)

*Primary Examiner* — Hoai V Ho
(74) *Attorney, Agent, or Firm* — Finnegan, Henderson, Farabow, Garrett & Dunner LLP

(57) ABSTRACT

According to an embodiment, a memory system includes first wiring lines; second wiring lines; third wiring lines; fourth wiring lines; and first and second storages. The first storage includes first memory cells arranged at intersections of the first wiring lines and the second wiring lines. Each of the third wiring lines is connected to any one of the first wiring lines. Each of the fourth wiring lines is pre-associated with a logical address specified by a host apparatus. The second storage includes second memory cells arranged at intersections of the third wiring lines and the fourth wiring lines. A resistance state of each of the second memory cells is set to a first resistance state or a second resistance state where a resistance value is lower than that in the first resistance state, according to a correspondence relationship between the logical address and the first wiring line.

19 Claims, 13 Drawing Sheets

(51) Int. Cl.
*G11C 16/06* (2006.01)
*G11C 16/04* (2006.01)
*G11C 11/56* (2006.01)
*G11C 16/08* (2006.01)
*G11C 16/26* (2006.01)
*G11C 13/00* (2006.01)

(52) U.S. Cl.
CPC ........ *G11C 13/004* (2013.01); *G11C 13/0023* (2013.01); *G11C 13/0069* (2013.01); *G11C 16/0408* (2013.01); *G11C 16/0483* (2013.01); *G11C 16/06* (2013.01); *G11C 16/08* (2013.01); *G11C 16/26* (2013.01); *G11C 13/0002* (2013.01); *G11C 2213/72* (2013.01); *G11C 2213/77* (2013.01)

(56) References Cited

U.S. PATENT DOCUMENTS

| | | |
|---|---|---|
| 2004/0172413 A1 | 9/2004 | Shin |
| 2004/0210570 A1 | 10/2004 | Shin |
| 2007/0103960 A1 | 5/2007 | Hamberg et al. |
| 2010/0161885 A1 | 6/2010 | Kanno et al. |
| 2010/0265748 A1 | 10/2010 | Lam et al. |
| 2013/0054886 A1 | 2/2013 | Eshraghian et al. |
| 2013/0188431 A1* | 7/2013 | Scheuerlein ............. G11C 7/04 365/189.09 |
| 2014/0204652 A1* | 7/2014 | Lee .................. G11C 29/50008 365/148 |

FOREIGN PATENT DOCUMENTS

| | | |
|---|---|---|
| JP | 2007-512655 | 5/2007 |
| JP | 4551958 | 9/2010 |
| JP | 2011-227788 | 11/2011 |

OTHER PUBLICATIONS

Written Opinion of The International Searching Authority issued by the Japanese Patent Office in International Application No. PCT/JP2014/075760, mailed Dec. 9, 2014 (6 pages).

* cited by examiner

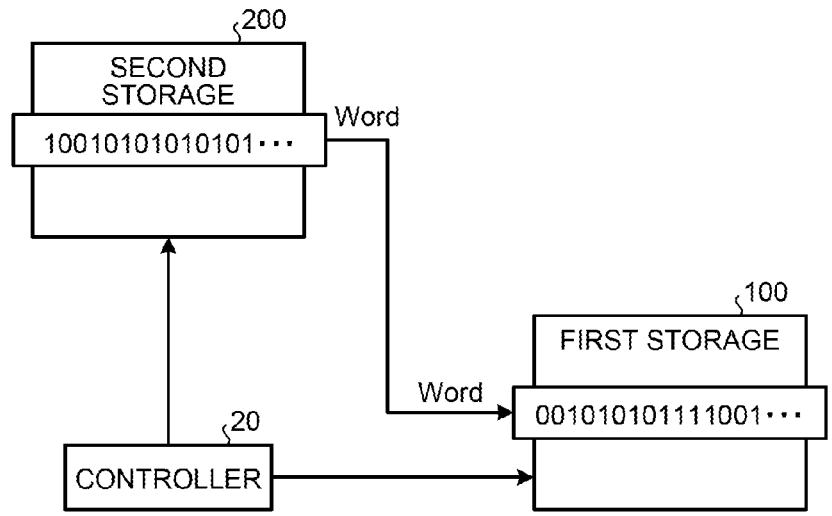
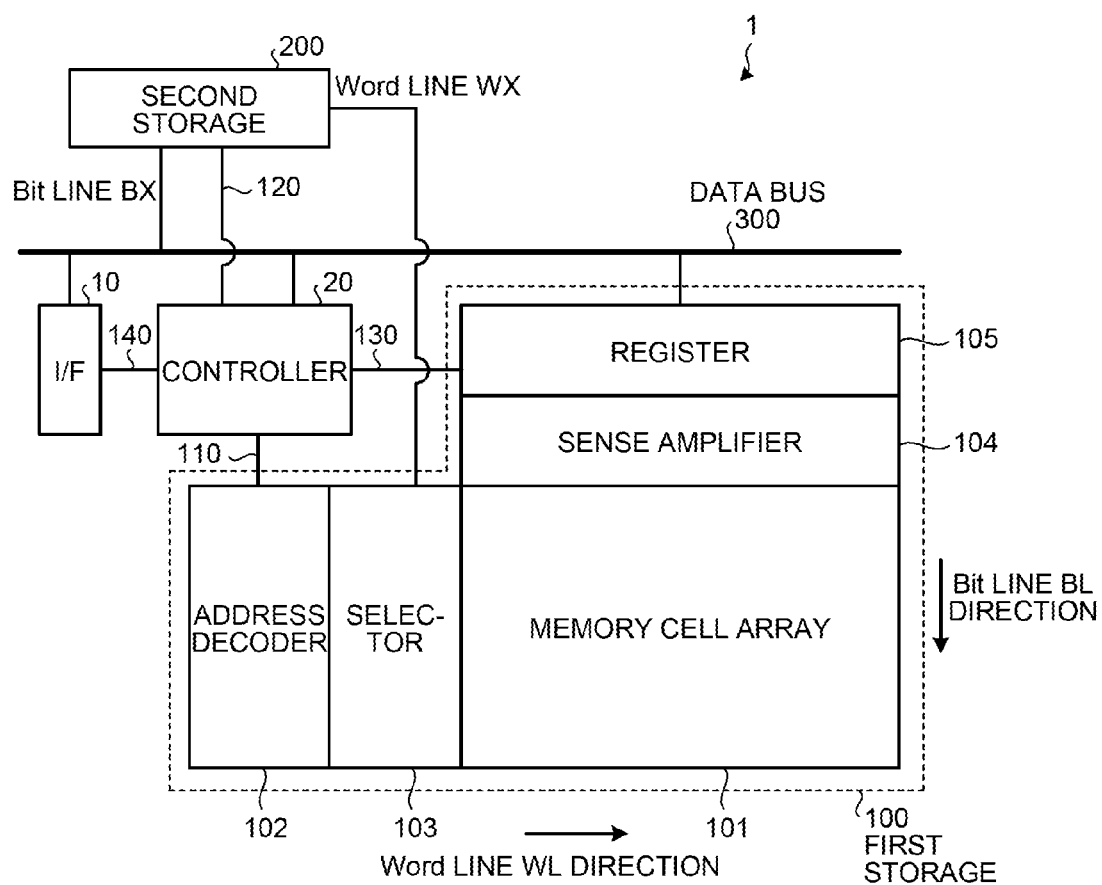

MEMORY SYSTEM

CROSS-REFERENCE TO RELATED APPLICATION

This application is a continuation of International Application No. PCT/JP2014/075760, filed on Sep. 19, 2014, which claims the benefit of priority from Japanese Patent Application No. 2013-195789, filed on Sep. 20, 2013; the entire contents of which are incorporated herein by reference.

FIELD

Embodiments described herein relate generally to a memory system.

BACKGROUND

As a storage apparatus included in a common host system, e.g., a computer system, there are a magnetic hard disk drive (HDD), a solid state drive (SSD) equipped with a nonvolatile semiconductor memory such as a NAND flash memory, an embedded NAND flash memory, etc. The SSD and the embedded NAND flash memory are categorized as storage, but can also be said to be memory systems with expanded size.

Such a memory system includes, for example, an interface, a first memory block, a second memory block, and a controller. The first memory block stores data. The second memory block is a buffer memory used upon writing/reading data. The first memory block is a nonvolatile memory and has a larger capacity than the second memory block, but has a low access rate. The second memory block is a temporary saving memory for processing an address conversion table of the first memory block. In addition, the second memory block is also used to compensate for a difference in speed between interface communication speed and the write/read speed of the first memory block.

For example, the first memory block is a nonvolatile flash memory. For example, the second memory block is a volatile DRAM or SRAM. Such a memory system employs a configuration for implementing the functions of writing/reading data associated with an address (logical address) specified by a host. In particular, a large-capacity memory system such as an SSD holds, as data, a table in which logical addresses specified by the host are associated with the physical addresses of the flash memory (logical-physical address conversion table). The controller that manages the reliability of the flash memory reads the logical-physical address conversion table into the second memory block, and performs the process of converting a logical address specified by the host to a physical address (logical-physical conversion process).

However, in conventional memory systems, a logical-physical conversion process by the controller is a factor that increases the time required to read or write data from/into the first memory block. For example, since the size of a logical-physical address conversion table increases as the storage capacity in a memory system increases, the time required to read the logical-physical address conversion table also increases. By this, the time required for a logical-physical conversion process increases, and as a result, a delay occurs in reading or writing data.

CITATION LIST

Patent Literature

Patent Literature 1: Japanese Patent No. 4551958
Patent Literature 2: JP-A 2005-209214 (KOKAI)

BRIEF DESCRIPTION OF THE DRAWINGS

FIG. 1 is a schematic diagram for describing a summary of the present invention.
FIG. 2 is a diagram illustrating a hardware configuration of a memory system of a first embodiment.

DETAILED DESCRIPTION

Figure 3:
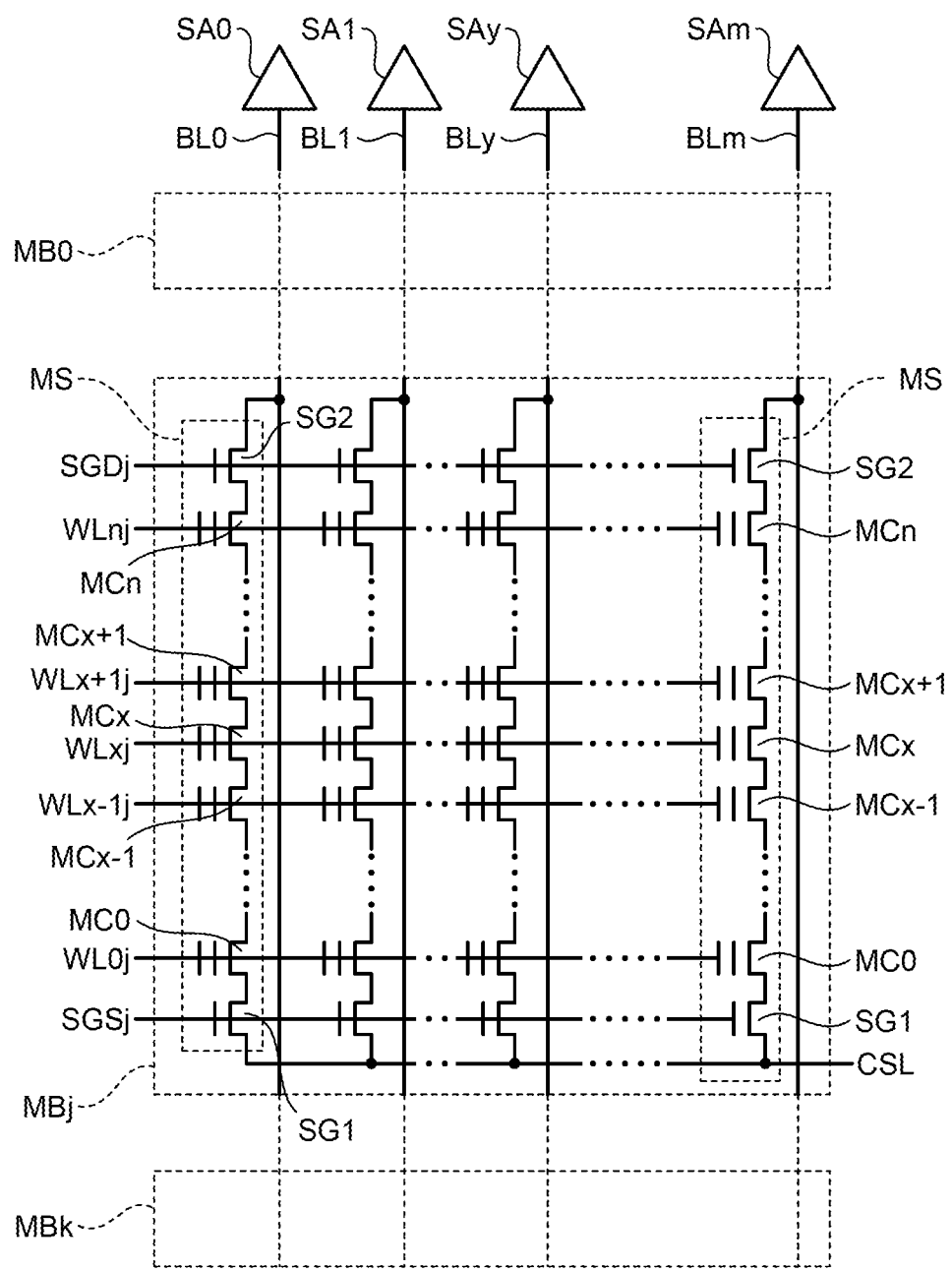
FIG. 3 is a diagram illustrating a schematic configuration of a memory cell array of a first storage of the first embodiment.

According to an embodiment, a memory system includes a plurality of first wiring lines; a plurality of second wiring lines; a first storage; a plurality of third wiring lines; a plurality of fourth wiring lines; and a second storage. The first storage includes a plurality of first memory cells arranged at intersections of the plurality of first wiring lines and the plurality of second wiring lines. Each of the third wiring lines is connected to any one of the plurality of first wiring lines. Each of the fourth wiring lines is pre-associated with a logical address specified by a host apparatus. The second storage includes a plurality of second memory cells arranged at intersections of the plurality of third wiring lines and the plurality of fourth wiring lines. A resistance state of each of the second memory cells is set to at least a first resistance state or a second resistance state where a resistance value is lower than that in the first resistance state, according to a correspondence relationship between the logical address and the first wiring line.

Before describing embodiments of memory systems according to the present invention, the basic configuration of the present invention will be described. FIG. 1 is a diagram schematically illustrating a memory system to which the present invention is applied. As illustrated in FIG. 1, the memory system includes a controller 20, a first storage 100, and a second storage 200.

The first storage 100 is a memory for saving files that has the largest storage capacity in the memory system and that has excellent reliability. The first storage 100 can be composed of, for example, a NAND flash memory. The second storage 200 is a memory that has a smaller storage capacity than the first storage 100, but has excellent random access performance and thus is capable of reading and writing at higher speed. The second storage 200 can be composed of, for example, a nonvolatile memory such as an MRAM, an ReRAM, a PCRAM, or an FeRAM.

In the memory system, in terms of storage and holding, the first storage 100 plays the main role, and thus, ensuring of long-term reliability is essential. It is desirable to use a NAND flash memory as the first storage 100. However, in this case, since data needs to be written or erased on a block basis, there is a need of an address conversion mechanism between a physical address indicating the actual position in the NAND flash memory and a logical address specified by a host system (which may be referred to as a "host apparatus" in the following description) external to the memory system.

Here, in a conventional type memory system, a table in which logical addresses and physical addresses are associated with each other (which may be referred to as a "logical-physical conversion table" or an "L2P table" in the following description) is held as data, and a controller performs the process of reading the L2P table into a working memory (a memory having a work area for a logical-physical conversion process) and converting a logical address specified by a host to a physical address (which may be referred to as "logical-physical conversion" or "L2P conversion" in the following description). It is known that the L2P conversion by the controller increases the time required to read or write data from/into the first storage (a NAND flash memory in this example). This processing speed depends on the size of the L2P table. For example, when the capacity of the first storage is a NAND flash memory of several chips and has a total capacity of 800 GB and the unit of a word, i.e., a page, is 8 KB, the number of words in the first storage is 100 M. That is, the number of physical addresses is 100 M in total. When the number of bits is "32", about 4G numbers can be represented. Thus, to handle 100 M physical addresses, it is sufficient that the number of bits be "32" (32 bits are sufficient). Since 32 bits is four bytes, eight bytes are required for one pair of a logical address and a physical address. Since there are 100 M of such a pair, the capacity of the L2P table is 800 MB. That is, the capacity of the L2P table is the size on the order of 1/1000 of the capacity of the first storage.

In the conventional type memory system, prior to performing L2P conversion for the first time, first, the L2P table needs to be read into the working memory from the first storage, and this reading requires time. For example, if it is assumed that the read throughput of the first storage is 100 MB/second, only reading the L2P table from the first storage requires eight seconds. Note, however, that once the L2P table has been read into the working memory, there is no need to transfer the entire L2P table from the next time. Even in that case, every time an L2P conversion process is performed, the controller requires time to find a target address from the L2P table. For example, when the operating clock frequency is 100 MHz, the controller operates at 10 ns per clock. If one instruction can be operated at one clock, the controller can process at 10 ns per instruction. Even if the controller can check 32 bits, i.e., an address of four bytes, for one instruction, if 100 M checks are required, then since 10 ns×100 M, one second is required. For example, if the L2P table is configured to be a multi-level table, then the check time per check can be reduced; however, since the number of reads from the working memory increases as the number of levels increases, an amount of time corresponding thereto is required. In reality, even if it is possible to perform the process of reading or writing the L2P at one millisecond or less by conventional methods, it is difficult to perform the process at one microsecond or less.

The memory system to which the present invention is applied achieves an improvement in the processing speed for reading or writing data from/into the first storage 100, by allowing the second storage 200 to have the L2P conversion function instead of the controller 20. Here, a connection relationship between the first storage 100 and the second storage 200 is important. In memory systems of embodiments which will be described below, it is essential that the word lines of the second storage 200 be directly connected to the word lines of the first storage 100. Embodiments of memory systems according to the present invention will be described in detail below with reference to the accompanying drawings.

First Embodiment

FIG. 2 is a diagram illustrating an example of a hardware configuration of a memory system 1 of a first embodiment. As illustrated in FIG. 2, the memory system 1 includes an interface 10, a controller 20, a first storage 100, a second storage 200, and a data bus 300. In the example of FIG. 2, the interface 10, the controller 20, the first storage 100, and the second storage 200 can mutually give and receive data through the data bus 300.

The interface 10 is connected to a host apparatus (host system) external to the memory system 1 through a bus such as AMBA (Advanced Microcontroller Bus Architecture). For the bus for connecting to the host apparatus, for example, SATA (Serial Advanced Technology Attachment), PCI Express, eMMC (embedded MMC), UFS (Universal Flash Storage), USB (Universal Serial Bus), etc., can be appropriately selected. Two or more types of bus lines may be used in the memory system 1 due to the difference in standard, etc.

The interface 10 can receive requests from the host apparatus external to the memory system 1. For example, the interface 10 can receive from the host apparatus a write request for requesting to write data into the first storage 100 and a read request for requesting to read data from the first storage 100. Here, a write request is configured to include data requested to be written and a raw address (physical address) indicating a position in the first storage 100 where the data is to be written, or is configured to include data requested to be written and a logical address indicating a location where the data requested to be written is allocated among virtual space addresses on a program. On the other hand, a read request is configured to include a raw address indicating a position in the first storage 100 where data is to be read, or is configured to include a logical address indicating a location where data requested to be read is allocated among virtual space addresses on a program. The logical addresses are specified by the host apparatus.

The controller 20 is a control apparatus that controls reading or writing of data from/into the first storage 100, in response to a request from the host apparatus which is received by the interface 10. The controller 20 is connected to an address decoder 102 through an address signal line 110 and is connected to the second storage 200 through a control signal line 120. In addition, the controller 20 is connected to a register 105 through a control signal line 130 and is connected to the interface 10 through a control signal line 140. In addition, the controller 20 includes a RAM having a work area for processes for controlling transmission and reception of signals to/from the interface 10, the second storage 200, and the first storage 100, and the like. Furthermore, the controller 20 can have an error correction (ECC) function for data outputted from the first storage 100. In the present embodiment, it is premised that the controller 20 has the ECC function, and data which is eventually outputted to the source (host apparatus) external to the memory system 1 through the interface 10 is outputted after being subjected to an ECC process.

The first storage 100 is an apparatus capable of storing data supplied from the source (e.g., the host apparatus) external to the memory system 1. In the following description, the case in which the first storage 100 is composed of a NAND flash memory is described as an example; however, the configuration is not limited thereto. Specific details of the first storage 100 will be described below.

As illustrated in FIG. 2, the first storage 100 includes a memory cell array 101, the address decoder 102, a selector 103, a sense amplifier 104, and the register 105. In the memory cell array 101 are arranged a plurality of word lines WL extending in a row direction (horizontal direction in FIG. 2) and a plurality of bit lines BL extending in a column direction (vertical direction in FIG. 2). The plurality of word lines WL are connected to the address decoder 102 through the selector 103. In addition, the plurality of bit lines BL are connected to the sense amplifier 104.

In FIG. 2, though detailed depiction is omitted, the memory cell array 101 has a plurality of memory cells arranged in a matrix form at intersections of the plurality of word lines WL and the plurality of bit lines BL. Each memory cell is a memory cell capable of storing information of two or more values, according to the amount of charge accumulated in a floating gate electrode, and may be referred to as a "first memory cell" in the following description. In this example, the first memory cell is of an FG type including a floating gate (conductive layer) formed on a p-type semiconductor substrate with a gate insulating film therebetween; and a control gate formed on the floating gate with an inter-gate insulating film therebetween; however, the configuration is not limited thereto. For example, the first memory cell may be of a MONOS type.

FIG. 3 is a diagram illustrating a schematic configuration of the memory cell array 101. In the example of FIG. 3, m+1 (m≥1) bit lines BL0 to BLm are provided, and the bit lines BL0 to BLm are arranged parallel to one another. In the following description, when the bit lines BL0 to BLm are not distinguished from each other, they are simply referred to as "bit lines BL". In addition, in the example of FIG. 3, m+1 amplifiers SA0 to SAm each corresponding to one of the bit lines BL0 to BLm are provided. The sense amplifier 104 illustrated in FIG. 2 is configured to include the m+1 amplifiers SA0 to SAm. Note that although in the example of FIG. 3 the case in which the amplifiers SA0 to SAm are provided for the respective bit lines BL0 to BLm is exemplified, the configuration is not limited thereto. For example, the configuration may be such that one amplifier is shared by two or more bit lines BL.

In addition, as illustrated in FIG. 3, in the memory cell array 101, k+1 (k≥1) memory blocks MB0 to MBk are provided, and the memory blocks MB0 to MBk are arranged side by side in the column direction along the bit lines BL0 to BLm. In the following description, when the memory blocks MB0 to MBk are not distinguished from each other, they are simply referred to as "memory blocks MB". Here, in each of the memory blocks MB0 to MBk, NAND strings MS are provided for the bit lines BL0 to BLm, respectively. Each NAND string MS is composed of a first memory cell group including n+1 (n≥1, e.g., n=31) first memory cells MC0 to MCn; and selection gate transistors (which may be simply referred to as "selection gates" in the following description) SG1 and SG2 provided at both ends of the first memory cell group. The memory cells MC0 to MCn are connected in series with each other, the selection gate SG1 is connected in series with the first memory cell MC0 at one end, and the selection gate SG2 is connected in series with the first memory cell MCn at the other end.

One ends of the respective NAND strings MS provided for the respective bit lines BL0 to BLm are connected to a cell source line CSL through their selection gates SG1 in a shared manner, and the other ends of the respective NAND strings MS are connected to the bit lines BL0 to BLm, respectively, through their selection gates SG2.

As illustrated in FIG. 3, in the memory block MBj, word lines WL0j to WLnj and selection gate lines SGSj and SGDj are arranged at right angles to the bit lines BL0 to BLm. Here, the word lines WL0j to WLnj are connected to the gate electrodes of the first memory cells MC0 to MCn, respectively, the selection gate line SGSj is connected to the gate electrode of the selection gate SG1, and the selection gate line SGDj is connected to the gate electrode of the selection gate SG2. Other memory blocks MB also have the same configuration. In the following description, when the word lines WL0j to WLnj are not distinguished from each other, they are simply referred to as "word lines WL".

Here, a first memory cell MCn in a NAND string MS provided to the bit line BL0 among the m+1 NAND strings MS included in the memory block MBj is, strictly speaking, not arranged at an intersection of the bit line BL0 and the word line WLnj; however, here, it can be considered that the first memory cell MCn is arranged at the intersection of the bit line BL0 and the word line WLnj. Likewise, a first memory cell MCn in a NAND string MS provided to the bit line BLm among the m+1 NAND strings MS included in the memory block MBj is also, strictly speaking, not arranged at an intersection of the bit line BLm and the word line WLnj; however, here, it can be considered that the first memory cell MCn is arranged at the intersection of the bit line BLm and the word line WLnj. Other first memory cells MC can also be considered in the same manner.

Description is continued referring back to FIG. 2. The address decoder 102 is connected to the controller 20 through the address signal line 110, and can receive an address (in this example, a page address (physical address) indicating any one of the plurality of word lines WL arranged in the memory cell array 101) provided from the controller 20. The address decoder 102 decodes the address provided from the controller 20, and selects any one of the word lines WL based on the result of the decoding. At this time, under the control of the controller 20, a predetermined voltage (e.g., a read voltage required for reading or a write voltage required for writing) generated by a voltage generator circuit which is not illustrated is supplied to the word line WL selected by the address decoder 102. Specific details of the selector 103 interposed between the address decoder 102 and the plurality of word lines WL will be described later.

Upon reading data, the sense amplifier 104 amplifies data read from a bit line BL connected to a read target first memory cell MC, and outputs the data to the register 105.

Next, a summary of operation performed upon reading data from the first storage 100 will be described. Upon reading data, first, in order to create a charge state where charge is accumulated in advance in each bit line BL, a predetermined charge voltage is supplied to each bit line BL. This is called precharge. Description is made using, as an example, a jth memory block MBj (see FIG. 3). As a voltage for allowing selection gates SG1 and SG2 to transition to an ON state, for example, 4 to 5 V is supplied to each of selection gate lines SGSj and SGDj. As a voltage V_READ (which may be referred to as a "read voltage V_READ" in the following description) for reading data, for example, 0 V is supplied to a word line WL corresponding to a selected page. As a predetermined voltage, for example, 5 V is supplied to other 31 (in this example, n=31) word lines WL. For each first memory cell (FG-MOSFET) whose gate electrode is connected to the word line WL to which the V_READ has been supplied, whether the source and drain of the FG-MOSFET are electrically conducted with each other is determined by whether a threshold voltage Vth is higher or lower than 0 V. If the source and the drain are electrically conducted with each other, the charge which is precharged in a corresponding bit line BL is released to a ground potential through a corresponding NAND string, and thus, the potential of the bit line BL decreases. By this, a signal for the bit line BL goes to a low level ("0"). On the other hand, if the source and the drain are not electrically conducted with each other, the charge which is precharged in the bit line BL is not released and the charge voltage is maintained, and thus, the signal for the bit line BL goes to a high level ("1"). In this manner, as a value indicating the storage state (threshold state) of a read target first memory cell (FG-MOSFET), "0" or "1" can be read.

Next, a summary of operation performed upon writing data into the first storage 100 will be described. In the case of writing data, as a selection voltage, for example, 0 V is supplied to a bit line BL on which writing is performed, and as a non-selection voltage, for example, a power supply voltage Vdd is supplied to a bit line BL not to be written, according to data temporarily held in the register 105. Here, writing of data corresponds to changing of the threshold value of a first memory cell (FG-MOSFET). Description is made using, as an example, a jth memory block MBj. As a voltage for allowing selection gates SG1 and SG2 to transition to an ON state, for example, 4 to 5 V is supplied to each of selection gate lines SGSj and SGDj. As a voltage V_PROGRAM (which may be referred to as a "write voltage V_PROGRAM" in the following description) for writing data, for example, 15 to 20 V is supplied to a word line WL corresponding to a selected page. A predetermined voltage (e.g., 10 V) is supplied to other 31 word lines.

By this write operation, a bit line BL selection voltage of 0 V has been transmitted as a channel potential to a write target first memory cell (a first memory cell arranged at an intersection of the word line WL to which the write voltage V_PROGRAM has been supplied and the bit line BL to which a selection voltage of 0 V has been supplied). Accordingly, a voltage corresponding to the V_PROGRAM is applied to the FG of the write target first memory cell, by which electrons are injected into the FG from the channel and the electrons are accumulated. When the electrons are accumulated, the threshold value of the FG-MOSFET increases. This state can be considered as a state where "0" is written. In the FG-MOSFET, electrons are not accumulated in the FG in the initial state upon manufacturing, and the threshold value is in a state of being lower than 0 V. Thus, this state can be considered as a state where "1" is written. That is, the principle of operation of the NAND flash memory is that "1" is stored in all of the first memory cells at first, and a first memory cell is changed to a state where "0" is written, by data write operation.

Note that, in a NAND string MS connected to a bit line BL to which a non-selection voltage (in this example, a power supply voltage Vdd) has been supplied, even if a voltage is provided to a word line WL, electrons are not injected into an FG. Because since Vdd has been applied to the bit line BL connected to the NAND string MS, the channel potential of a selected FG-MOSFET is in a state of being raised to a high value through the channels of non-selected FG-MOSFETs in the NAND string MS, only a voltage which is sufficiently smaller than the write voltage V_PROGRAM is applied to the FG of a write target first memory cell connected to a selected word line WL (a word line WL to which the write voltage V_PROGRAM has been supplied).

Next, a summary of operation performed when data stored in the first storage 100 is erased will be described. Description is made using, as an example, a jth memory block MBj (see FIG. 3). In a region including all of those word lines WL enclosed by selection gates SG1 and SG2 and the bit lines BL, i.e., the memory block MBj, after bringing a word line voltage to 0 V and a bit line voltage to a floating potential, an erase voltage V_ERA is applied to wells in the block to pull electrons off all first memory cells toward the substrate well side. For writing and erasing, variations in changes in threshold value occur between first memory cells connected to the same word line WL. Thus, for a first memory cell with a small change, a determination is made by a procedure for verifying it. For a bit line BL having a first memory cell whose amount of change in threshold value is not sufficient, writing or erasing is additionally performed. The NAND flash memory can also perform multi-value operation according to the magnitude of the threshold value. Basic operation is the same as that for two values. However, in the case of multi-value operation, the voltage level used upon reading is divided into detailed levels, and upon writing, too, writing is performed such that the threshold value is divided into detailed levels while verifying the amount of change in threshold value. Thus, detailed sequences thereof differ. In addition, in the case of multi-value operation, since the threshold value is divided into detailed levels, it is easily influenced by a change in threshold value caused by capacitive coupling between adjacent first memory cells. Hence, a device such as performing writing such that write pages (word lines) are not adjacent to each other may be performed.

Although, in the present embodiment, the above-described first storage 100 is composed of a NAND flash memory, the configuration is not limited thereto, and every storage medium can be used as long as the storage medium is a semiconductor memory having nonvolatile storage properties. For example, as the first storage 100, a nonvolatile memory such as an MRAM (Magnetoresistive Random Access Memory), an ReRAM (Resistive Random Access Memory), an FeRAM (Ferroelectric Random Access Memory), or a PCRAM (Phase Change Random Access Memory) may be used. In a word, the first storage 100 may be any storage apparatus including a plurality of first memory cells arranged in a matrix form at intersections of a plurality of first wiring lines and a plurality of second wiring lines.

Next, the second storage 200 will be described. In the present embodiment, the second storage 200 has the L2P conversion function. As will be described later, word lines WX of the second storage 200 are connected to the word lines WL of the first storage 100 through the selector 103. In addition, bit lines BX (described later) of the second storage 200 may be connected to the data bus 300. In the following description, the case in which the second storage 200 is composed of an RePAM is described as an example; however, the configuration is not limited thereto. Specific details of the second storage 200 will be described below.

Figure 4:
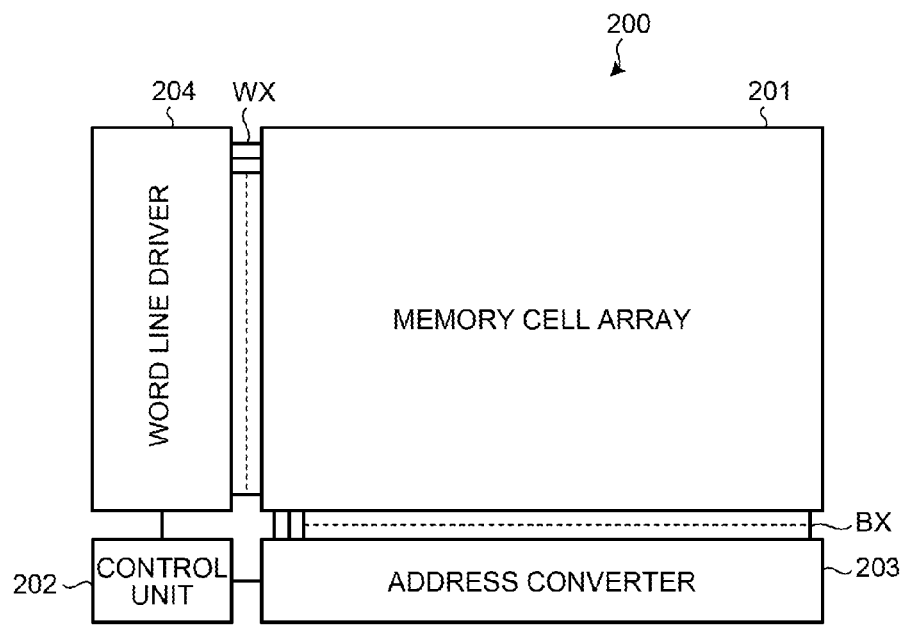
FIG. 4 is a diagram illustrating an exemplary configuration of a second storage of the first embodiment.

FIG. 4 is a diagram illustrating an exemplary configuration of the second storage 200. As illustrated in FIG. 4, the second storage 200 includes a memory cell array 201, a control unit 202, an address converter 203, and a word line driver 204.

The memory cell array 201 includes a plurality of second memory cells arranged in a matrix form at intersections of a plurality of word lines WX and a plurality of bit lines BX. Each of the plurality of word lines WX is connected to any one of the plurality of word lines WL of the first storage 100. Each of the plurality of bit lines BX is pre-associated with a logical address specified by the host apparatus. The word lines WX may be referred to as "third wiring lines", the bit lines BX to as "fourth wiring lines", the word lines WL of the first storage 100 to as "first wiring lines", and the bit lines BL of the first storage 100 to as "second wiring lines"; however, the configuration is not limited thereto. Note that a connection relationship between the second storage 200 and the first storage 100 will be described later.

In the present embodiment, each second memory cell includes a variable resistance element sandwiched between a word line WX and a bit line BX, and the resistance state of the second memory cell is set to at least a first resistance state or a second resistance state where the resistance value is lower than that in the first resistance state, according to voltages applied to the word line WX and the bit line BX which are connected to the second memory cell.

Figure 5:
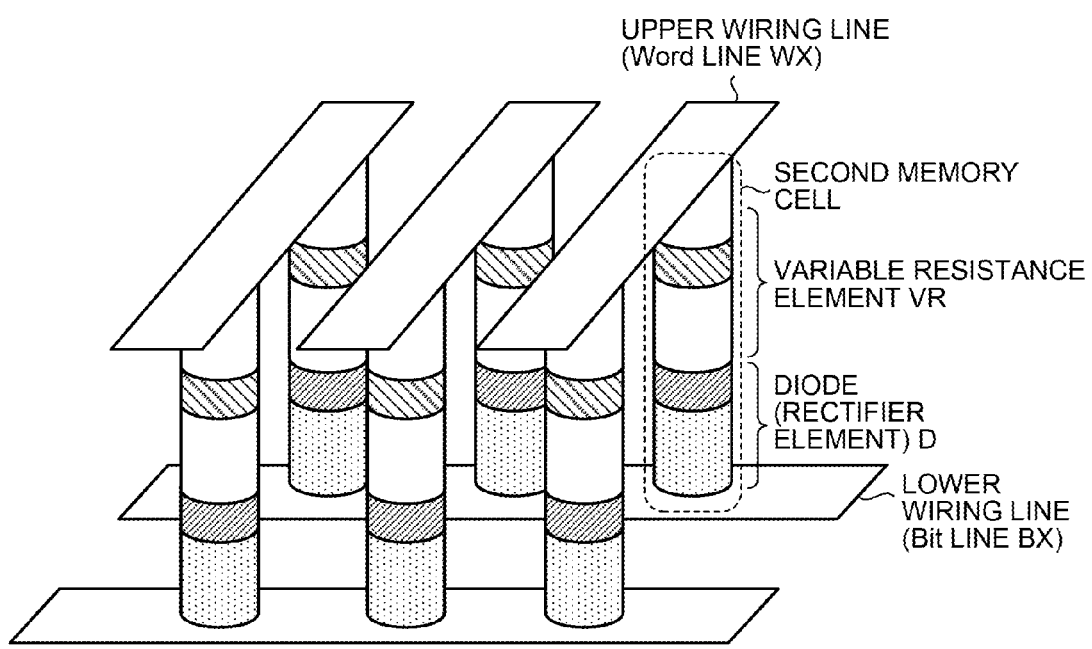
FIG. 5 is a diagram illustrating a specific structure of a memory cell array of the second storage of the first embodiment.

FIG. 5 is a diagram illustrating an example of a specific structure of the memory cell array 201. As illustrated in FIG. 5, a plurality of upper wiring lines (in this example, the word lines WX) extending in a first direction (vertical direction in FIG. 5) and a plurality of lower wiring lines (in this example, the bit lines BX) extending in a second direction (horizontal direction in FIG. 5) orthogonal to the first direction are arranged so as to face each other in the vertical direction and intersect each other. At each intersection, a cylindrical second memory cell is formed between an upper wiring line and a lower wiring line. In the example of FIG. 5, a second memory cell is configured to include a variable resistance element VR and a diode (rectifier element) D which are connected in series with each other. The diode D is provided to suppress a sneak current, a so-called sneak path, between wiring lines.

In this example, the variable resistance element VR transitions between two resistance states, a high resistance state (may be referred to as a "first resistance state") and a low resistance state (may be referred to as a "second resistance state"). For example, when the voltages of a word line WX and a bit line BX are controlled such that a predetermined forward voltage is applied between both ends of the second memory cell, a conductive filament by a diffused metal element is formed in the variable resistance element VR, and thus, the variable resistance element VR transitions to a low resistance state. When the voltages of the word line WX and the bit line BX are controlled such that a predetermined reverse voltage is applied between both ends of the second memory cell, the diffused metal element in the variable resistance element VR is collected and the conductive filament disappears, and thus, the variable resistance element VR transitions to a high resistance state. Note that, for example, the variable resistance element VR may be configured to transition between three or more resistance states.

The size of the memory cell array 201 of the second storage 200 is, for example, 8 Mbits×8 Mbits (i.e., 1 MByte×1 MByte), etc. The storage capacity at this time is 1 TByte. When a chip is 2 cm×2 cm in area, if the wiring lines are 10 nm in width and the wiring pitches are 20 nm, 2 cm÷20 nm=1×10$^6$ wiring lines can be formed. Furthermore, since multiple layers are possible in the case of an ReRAM, if there are eight or more layers of this, a size of 8 Mbits×8 Mbits or more can be achieved.

Figure 6:
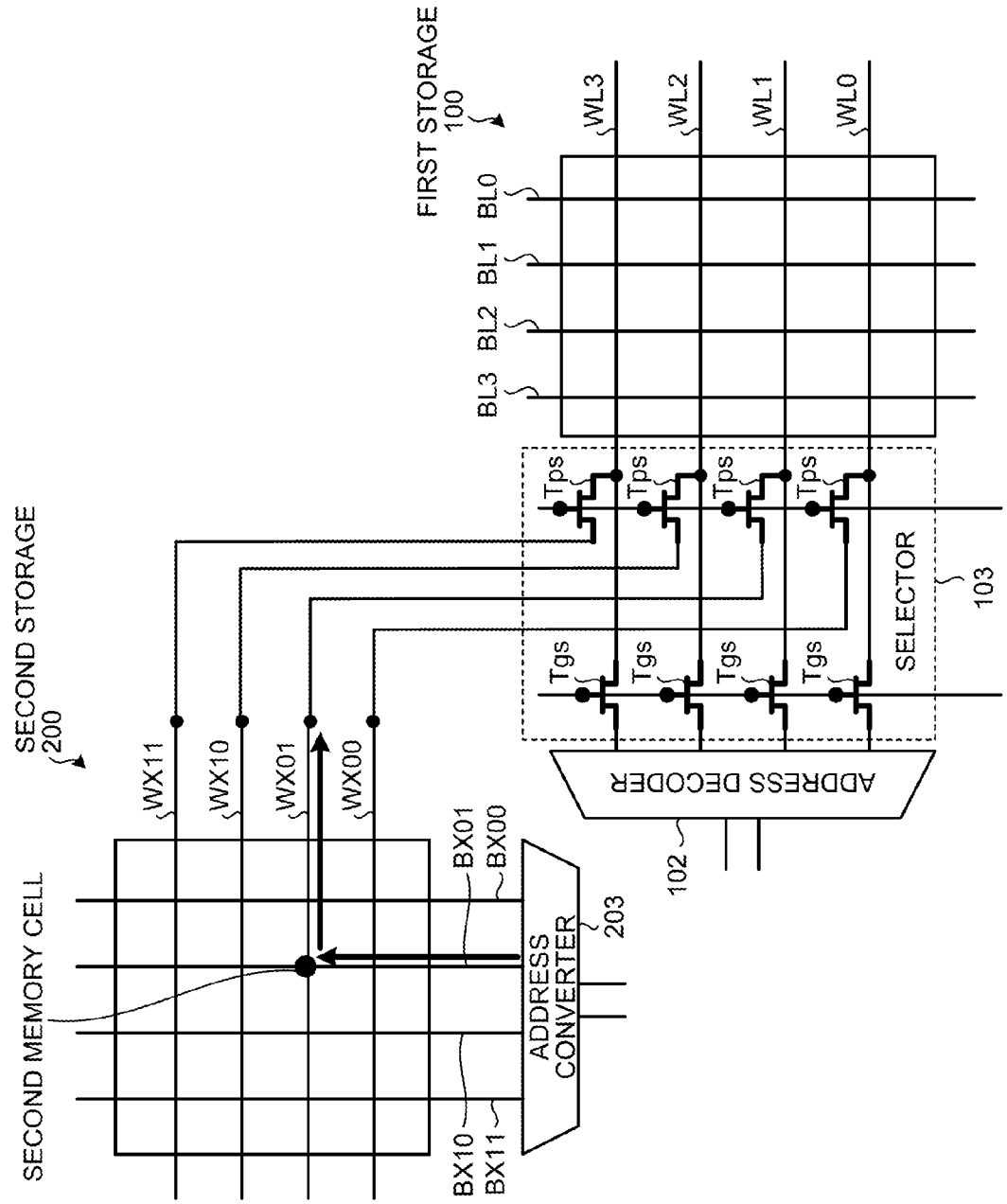
FIG. 6 is a diagram illustrating a connection relationship between the first storage and the second storage of the first embodiment.

FIG. 6 is a diagram for describing a connection relationship between the second storage 200 and the first storage 100. Here, for simplification, a mode is illustrated in which four word lines WX (WX00 to WX11) and four bit lines BX (BX00 to BX11) are arranged in the memory cell array 201 of the second storage 200, and four word lines WL (WL0 to WL3) and four bit lines BL (BL0 to BL3) are arranged in the memory cell array 101 of the first storage 100.

In addition, the selector 103 of the first storage 100 illustrated in FIG. 6 is configured to include a plurality of pass transistors Tps and a plurality of gate transistors Tgs. Each of the plurality of pass transistors Tps corresponds to one of the plurality of word lines WX of the second storage 200. Under the control of the controller 20, each pass transistor Tps switches to establish a connection between a corresponding word line WX and any one of the word lines WL of the first storage 100. As will be described later, when the controller 20 performs reading or writing of data from/ into the first storage 100 based on a logical address, while the controller 20 controls each of the plurality of pass transistors Tps to be an ON state, the controller 20 controls each of the plurality of gate transistors Tgs to be an OFF state. In this example, the controller 20 may be referred to as a "fourth controller". Note that the configuration is not limited thereto, and the subject that controls ON and OFF of the plurality of pass transistors Tps may be, for example, the control unit 202 of the second storage 200. In this case, the control unit 202 may be referred to as the "fourth controller".

Each of the plurality of gate transistors Tgs each corresponds to one of the plurality of word lines WL of the first storage 100. Under the control of the controller 20, each gate transistor Tgs switches to establish a connection between a corresponding word line WL and the address decoder 102. As will be described later, when the controller 20 performs reading or writing of data from/into the first storage 100 based on a raw address, while the controller 20 controls each of the plurality of gate transistors Tgs to be an ON state, the controller 20 controls each of the plurality of pass transistors Tps to be an OFF state.

As illustrated in FIG. 6, each of the four word lines WX (WX00 to WX11) of the second storage 200 is connected to any one of the four word liens WL (WL0 to WL3) of the first storage 100 through a corresponding pass transistor Tps. In the example of FIG. 6, the word line WX11 is connected to the word line WL3, the word line WX10 is connected to the word line WL2, the word line WX01 is connected to the word line WL1, and the word line WX00 is connected to the word line WL0. Note that connection of a word line WX to a word line WL includes both of a mode in which, as illustrated in FIG. 6, the connection is established through a pass transistor Tps or the like, and a mode in which the connection is established directly without through a pass transistor Tps or the like.

In addition, as will be described later, upon reading or writing data based on a logical address, the logical address is inputted to the address converter 203 of the second storage 200, and one bit line BX is selected. In the example of FIG. 6, a logical address indicating a 2-bit value is inputted and any one of the four bit lines BX is selected. Looking at it another way, it can be considered that each of the four bit lines BX is pre-associated with a logical address.

In the present embodiment, the resistance state of each of the plurality of second memory cells is set to either one of a high resistance state and a low resistance state, according to a correspondence relationship between a logical address and a word line WL of the first storage 100 (looking at it another way, a physical address identifying a page in the first storage 100). The correspondence relationship represents a correspondence between a logical address and a word line WL (word line WL to be selected) to which a read voltage V_READ for reading data or a write voltage V_PROGRAM for writing data is supplied upon reading or writing data based on the logical address. For example, in FIG. 6, it is assumed that the bit line BX01 of the second storage 200 is pre-associated with the logical address "01". Upon reading or writing data with the logical address "01" specified, if the word line WL1 of the first storage 100 is selected (if the logical address "01" is associated with the word line WL1 of the first storage 100), then the resistance state of a second memory cell arranged at an intersection of the bit line BX01 associated with the logical address "01" and the word line WX01 connected to the word line WL1 of the first storage 100 is preset to a low resistance state. On the other hand, the resistance states of three second memory cells arranged at intersections of the bit line BX01 and other three word lines (WX00, WX10, and WX11) are preset to a high resistance state.

As will be described later, upon reading data based on a logical address, in order that a read voltage V_READ is supplied to a word line WL of the first storage 100 associated with a second memory cell in a low resistance state connected to a bit line BX associated with the specified logical address (a word line WL of the first storage 100 connected through the selector 103 to a word line WL connected to a second memory cell in a low resistance state), a first voltage is supplied to the bit line BX associated with the specified logical address. In addition, upon writing data based on a logical address, in order that a write voltage V_PROGRAM is supplied to a word line WL of the first storage 100 associated with a second memory cell in a low resistance state connected to a bit line BX associated with the specified logical address, a second voltage is supplied to the bit line BX associated with the specified logical address.

In FIG. 6, the case is assumed in which, for example, upon reading or writing data based on the logical address "01", a predetermined voltage (first voltage or second voltage) is supplied to the bit line BX01 associated with the logical address "01". Since, as described above, a second memory cell arranged at an intersection of the bit line BX01 and the word line WX01 is set to a low resistance state, a current flows in a direction from the bit line BX01 to the word line WX01. This becomes an electrical signal and is transmitted to the word line WL1 of the first storage 100 through the selector 103.

Description is continued referring back to FIG. 4. The control unit 202 controls the operation of the second storage 200. The control unit 202 is connected to the controller 20 through the control signal line 120 illustrated in FIG. 2. The control unit 202 has the function of receiving from the controller 20 a logical address included in a read request from the host apparatus, and the function (which may be referred to as a "first controller") of controlling supply of a predetermined voltage (which may be referred to as a "first voltage" in the following description) to a bit line BX associated with the logical address received from the controller 20, such that a read voltage V_READ is supplied to a word line WL of the first storage 100 associated with a second memory cell in a low resistance state connected to the bit line BX associated with the logical address received from the controller 20. It is desirable that the first voltage be set taking into account a voltage drop caused by conductive materials (wiring lines, the second memory cell in a low resistance state, etc.) placed all the way to the word line WL of the first storage 100, etc.

When the control unit 202 receives a read signal which will be described later and a logical address (a logical address included in a read request) from the controller 20, the control unit 202 sends the received logical address to the address converter 203. In addition, the control unit 202 instructs a voltage generator circuit which is not illustrated, to generate the first voltage. The address converter 203 decodes the logical address provided from the control unit 202, and selects a corresponding bit line BX based on the result of the decoding. At this time, the first voltage generated by the voltage generator circuit which is not illustrated is supplied to the bit line BX selected by the address converter 203. Specific details of read operation will be described later.

In addition, the control unit 202 has the function of receiving from the controller 20 a logical address included in a write request sent from the host apparatus, and the function (may be referred to as a "second controller") of controlling supply of a predetermined voltage (which may be referred to as a "second voltage" in the following description) to a bit line BX associated with the logical address received from the controller 20, such that a write voltage V_PROGRAM for writing data is supplied to a word line WL of the first storage 100 associated with a second memory cell in a low resistance state connected to the bit line BX. It is desirable that the second voltage be set taking into account a voltage drop caused by conductive materials (wiring lines, the second memory cell in a low resistance state, etc.) placed all the way to the word line WL of the first storage 100, etc.

When the control unit 202 receives a write signal which will be described later and a logical address (a logical address included in a write request) from the controller 20, the control unit 202 sends the received logical address to the address converter 203. In addition, the control unit 202 instructs a voltage generator circuit which is not illustrated, to generate the second voltage. The address converter 203 decodes the logical address provided from the control unit 202, and selects a corresponding bit line BX based on the result of the decoding. At this time, the second voltage generated by the voltage generator circuit which is not illustrated is supplied to the bit line BX selected by the address converter 203. Specific details of write operation will be described later.

Here, although the control unit 202 has both of the function which is referred to as the "first controller" and the function which is referred to as the "second controller", the configuration is not limited thereto. The configuration may be such that the function which is referred to as the "first controller" and the function which is referred to as the "second controller" are provided separately.

The word line driver 204 outputs to each word line WX a voltage to be supplied to the word line under the control of the control unit 202.

Although, as described above, in the present embodiment, the second storage 200 is composed of an ReRAM, the configuration is not limited thereto. For example, as the second storage 200, a nonvolatile memory such as an MRAM (Magnetoresistive Random Access Memory), a PCRAM, or an FeRAM may be used. In a word, the second storage 200 may be any storage apparatus including a plurality of second memory cells which are arranged in a matrix form at intersections of a plurality of third wiring lines, each connected to any one of the first wiring lines, and a plurality of fourth wiring lines pre-associated with logical addresses specified by the host apparatus, and whose resistance states are set to at least a first resistance state or a second resistance state where the resistance value is lower than that in the first resistance state, according to a correspondence relationship between the logical addresses and the first wiring lines.

Figure 7:
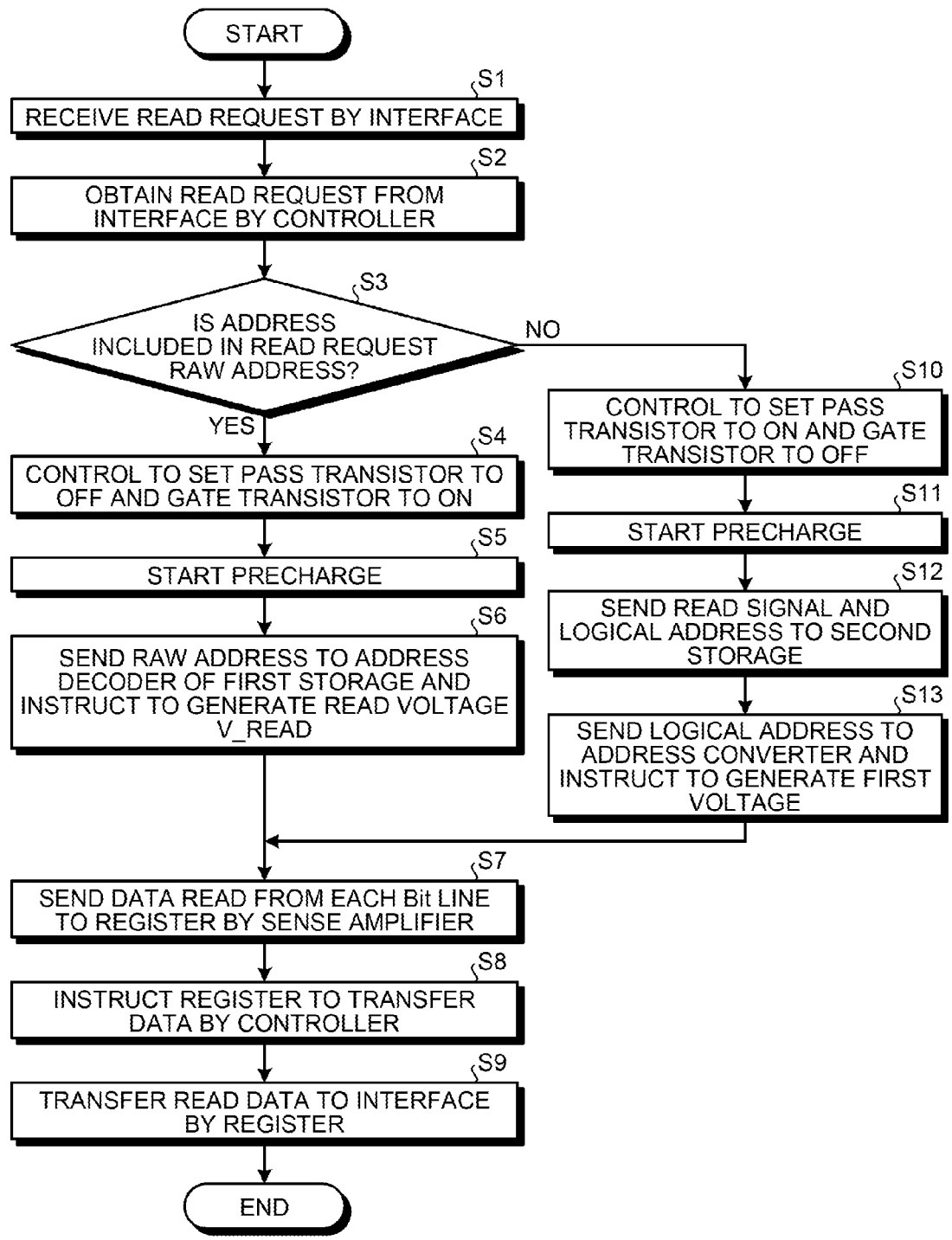
FIG. 7 is a flowchart illustrating the operation of reading data from the first storage of the first embodiment.

Next, with reference to FIG. 7, the operation of reading data from the first storage 100 will be described. FIG. 7 is a flowchart illustrating an example of the operation of reading data from the first storage 100. As illustrated in FIG. 7, first, the interface 10 receives a read request from the host apparatus external to the memory system 1 (step S1). In order to notify of the reception of the read request from the host apparatus, the interface 10 may be configured to send an electrical signal to the controller 20, or may be configured to update a value in the register that is read or written directly by the controller 20. In the configuration of updating a value in the register, when the interface 10 updates a value in the register, the controller 20 monitoring the register detects a change in the value in the register.

Then, the controller 20 obtains the read request from the interface 10 (step S2) and stores an address included in the read request in an internal memory of the controller 20. Then, the controller 20 determines whether the address included in the read request is a raw address (a physical address by which a page (word line WL) of the first storage 100 can be identified) (step S3). Since the read request is in a format such as, for example, READ (#address, determination bit, . . . ), it can be determined, for example, that the address is a raw address when the determination bit indicates "0", and the address is a logical address when the determination bit indicates "1". Alternatively, it can also be determined that the address is a raw address when #address included in the read request is 32 bits and the highest bit is 0, and the address is a logical address when the highest bit is 1.

If it is determined at the above-described step S3 that the address is a raw address (step S3: YES), the controller 20 first controls each of the plurality of pass transistors Tps to be an OFF state and controls each of the plurality of gate transistors Tgs to be an ON state (step S4). Then, the controller 20 starts the aforementioned precharge and controls the selection gates of the NAND strings MS to be an ON state (step S5). Then, the controller 20 sends the raw address to the address decoder 102 of the first storage 100, and instructs a voltage generator circuit which is not illustrated, to generate a read voltage V_READ (step S6). In the above-described manner, "0" or "1" can be read as values indicating the storage states (threshold states) of a plurality of first memory cells (FG-MOSFETs) arranged at intersections of a word line WL indicated by the raw address and each of the plurality of bit lines BL. Note that the order of the above-described steps S4 to S6 is an example and the configuration is not limited thereto.

Then, the sense amplifier 104 of the first storage 100 sends data read from each bit line BL, to the register 105 (step S7). At a stage where the data is held in the register 105, a signal is transmitted to the controller 20 from the register 105, and the controller 20 instructs the register 105 to transfer the data (step S8). Then, the register 105 transfers the read data to the interface 10 through the data bus 300 (step S9).

On the other hand, if it is determined at the above-described step S3 that the address is not a raw address, i.e., the address is a logical address (step S3: NO), the controller 20 first controls each of the plurality of pass transistors Tps to be an ON state and controls each of the plurality of gate transistors Tgs to be an OFF state (step S10). Then, the controller 20 starts the aforementioned precharge and controls the selection gates of the NAND strings MS to be an ON state (step S11). Then, the controller 20 sends a read signal instructing to read and a logical address included in the read request (step S12). The control unit 202 of the second storage 200 receives a pair of the read signal and the logical address from the controller 20 through the control signal line 120. Then, the control unit 202 sends to the address converter 203 the logical address received from the controller 20, and instructs the voltage generator circuit which is not illustrated, to generate the above-described first voltage (step S13).

In the above-described manner, the first voltage generated by the voltage generator circuit which is not illustrated is supplied to a bit line BX selected by the address converter 203 (a bit line BX pre-associated with the specified logical address). Then, an electrical signal according to the first voltage is transmitted to a word line WL of the first storage 100 via a word line WX connected to a second memory cell which is preset to a low resistance state according to a correspondence relationship between the logical address and the word line WL of the first storage 100 among a plurality of second memory cells connected to the bit line BX. By this, a read voltage V_READ is applied to the word line WL, and "0" or "1" can be read as values indicating the storage states (threshold states) of a plurality of first memory cells (FG-MOSFETs) arranged at intersections of the word line WL and each of the plurality of bit lines BL. After step S13, those processes at and after the above-described step S7 are performed. Note that the order of the above-described steps S10 to S13 is an example and the configuration is not limited thereto.

Figure 8:
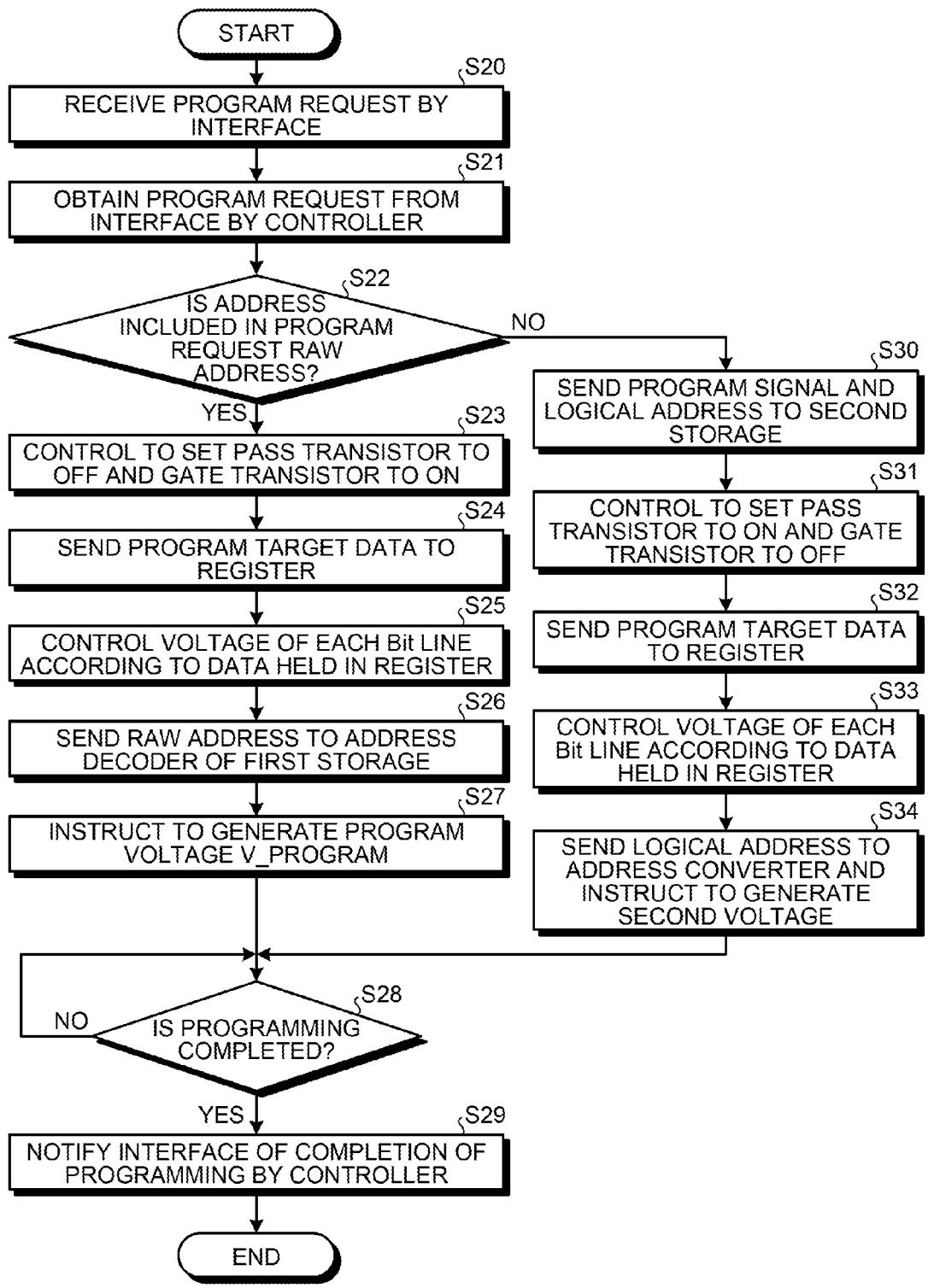
FIG. 8 is a flowchart illustrating the operation of writing data into the first storage of the first embodiment.

Next, with reference to FIG. 8, the operation of writing data into the first storage 100 will be described. FIG. 8 is a flowchart illustrating an example of the operation of writing data into the first storage 100. As illustrated in FIG. 8, first, the interface 10 receives a write request from the host apparatus (step S20). In order to notify of the reception of the write request from the host apparatus, the interface 10 may be configured to send an electrical signal to the controller 20, or may be configured to update a value in the register that is read or written directly by the controller 20.

Then, the controller 20 obtains the write request from the interface 10 (step S21) and stores an address included in the write request in an internal memory of the controller 20. In addition, the controller 20 buffers data included in the write request (data requested to be written) in another memory temporarily managed by the controller 20, or transfers the data to the register 105 of the first storage 100.

Then, the controller 20 determines whether the address included in the write request is a raw address (step S22). Since the write request is in a format such as WRITE (#address, determination bit, . . . , data or location address of data), it can be determined, for example, that the address is a raw address when the determination bit indicates "0", and the address is a logical address when the determination bit indicates "1". Alternatively, it can also be determined that the address is a raw address when #address included in the write request is 32 bits and the highest bit is 0, and the address is a logical address when the highest bit is 1.

If it is determined at the above-described step S22 that the address is a raw address (step S22: YES), the controller 20 first controls each of the plurality of pass transistors Tps to be an OFF state and controls each of the plurality of gate transistors Tgs to be an ON state (step S23). Then, the controller 20 sends the data included in the write request (write target data) to the register 105 (step S24). Then, while the controller 20 controls supply of a selection voltage (e.g., 0 V) to a bit line BL on which writing is performed, the controller 20 controls supply of a non-selection voltage (e.g., a power supply voltage Vdd) to a bit line BL not to be written, according to the data held in the register 105 (step S25). In addition, the controller 20 controls the selection gates of the NAND strings MS to be an ON state. Then, the controller 20 sends an address signal indicating the raw address to the address decoder 102 of the first storage 100 (step S26). Then, the controller 20 instructs a voltage generator circuit which is not illustrated, to generate a write voltage V_PROGRAM (step S27). By this, the write voltage V_PROGRAM generated by the voltage generator circuit which is not illustrated is supplied to a word line WL selected by the address decoder 102. In the above-described manner, a write target first memory cell (a first memory cell arranged at an intersection of the word line WL to which the write voltage V_PROGRAM has been supplied and the bit line BL to which the selection voltage has been supplied) can be changed to a state where "0" is written. Note that the order of the above-described steps S23 to S27 is an example and the configuration is not limited thereto.

In the present embodiment, an internal logic circuit of the register 105 verifies whether writing of the data has been normally performed, and a signal is transmitted to the controller 20 at the stage where the writing is completed (step S28: YES). The controller 20 having detected the completion of the writing notifies the interface 10 of the completion of the writing (step S29).

On the other hand, if it is determined at the above-described step S22 that the address is not a raw address, i.e., the address is a logical address (step S22: NO), the controller 20 first sends to the second storage 200 a write signal instructing to write and a logical address included in the write request (step S30). Then, the controller 20 controls each of the plurality of pass transistors Tps to be an ON state and controls each of the plurality of gate transistors Tgs to be an OFF state (step S31). Then, the controller 20 sends write target data included in the write request to the register 105 (step S32). Then, while the controller 20 controls supply of a selection voltage (e.g., 0 V) to a bit line BL on which writing is performed, the controller 20 controls supply of a non-selection voltage (e.g., a power supply voltage Vdd) to a bit line BL not to be written, according to the data held in the register 105 (step S33). In addition, the controller 20 controls the selection gates of the NAND strings to be an ON state.

The control unit 202 of the second storage 200 receives a pair of the write signal and the logical address from the controller 20 through the control signal line 120. Then, the control unit 202 sends to the address converter 203 the logical address received from the controller 20, and instructs the voltage generator circuit which is not illustrated, to generate the above-described second voltage (step S34). In the above-described manner, the second voltage generated by the voltage generator circuit which is not illustrated is supplied to a bit line BX selected by the address converter 203 (a bit line BX pre-associated with the specified logical address). Then, an electrical signal according to the second voltage is transmitted to a word line WL of the first storage 100 via a word line WX connected to a second memory cell which is preset to a low resistance state according to a correspondence relationship between the logical address and the word line WL among a plurality of second memory cells connected to the bit line BX. By this, a write voltage V_PROGRAM is applied to the word line WL, and a write target first memory cell arranged at an intersection of the word line WL and the bit line BL to which the selection voltage has been supplied can be changed to a state where "0" is written. After step S34, those processes at and after the above-described step S28 are performed. Note that the order of the above-described steps S30 to S34 is an example and the configuration is not limited thereto.

As described above, the memory system 1 according to the present embodiment includes the first storage 100 including a plurality of first memory cells arranged in a matrix form at intersections of the plurality of word lines WL and the plurality of bit lines BL; and the second storage 200 including a plurality of second memory cells arranged in a matrix form at intersections of the plurality of word lines WX, each connected to any one of the word lines WL, and the plurality of bit lines BX, each pre-associated with a logical address specified by the host apparatus. The resistance states of the plurality of second memory cells included in the second storage 200 are preset to a high resistance state or a low resistance state, according to a correspondence relationship between the logical addresses and the word lines WL of the first storage 100.

For example, upon reading data based on a logical address specified by the host apparatus, the control unit 202 of the second storage 200 controls supply of the above-described first voltage to a bit line BX which is pre-associated with the specified logical address, by which the control unit 202 can apply a read voltage V_READ to a word line WL of the first storage 100 associated with a second memory cell in a low resistance state which is connected to the bit line BX (a word line WL associated with the specified logical address). That is, in the present embodiment, selection of a word line WL of the first storage 100 associated with a specified logical address and supply of a read voltage V_READ can be simultaneously performed without performing the process of reading an L2P table held as data, the process of finding a physical address associated with a logical address, by referring to the read L2P table, etc., which are performed in conventional memory systems. Accordingly, the processing speed for reading data can be improved. For example, in the case of an MRAM or an ReRAM, the typical read speed is 30 ns. When the memory is not designed as a RAM, the read speed can be further increased.

In addition, for example, upon writing data based on a logical address specified by the host apparatus, the control unit 202 of the second storage 200 controls supply of the above-described second voltage to a bit line BX which is pre-associated with the specified logical address, by which the control unit 202 can apply a write voltage V_PROGRAM to a word line WL of the first storage 100 associated with a second memory cell in a low resistance state which is connected to the bit line BX (a word line WL associated with the specified logical address). That is, in the present embodiment, selection of a word line WL of the first storage 100 associated with a specified logical address and supply of a write voltage V_PROGRAM can be simultaneously performed without performing the process of reading an L2P table held as data, the process of finding a physical address associated with a logical address, by referring to the read L2P table, etc., which are performed in conventional memory systems. Accordingly, the processing speed for writing data can be improved. For example, in the case of an MRAM or an ReRAM, the typical write speed is 30 ns. When the memory is not designed as a RAM, the write speed can be further increased.

Namely, in the present embodiment, by having a configuration in which the word lines WX of the second storage 200 are directly connected to the word lines WL of the first storage 100, and the resistance states of the plurality of second memory cells included in the second storage 200 are set to at least a high resistance state or a low resistance state, according to a correspondence relationship between the logical addresses and the word lines WL, an advantageous effect can be achieved that the processing speed for reading or writing data can be significantly improved.

Second Embodiment

Next, a second embodiment will be described. A memory system of the second embodiment (represented as the "memory system 2" in the following description) has the function of changing a second memory cell to be set to a low resistance state, in addition to the functions described in the first embodiment. Specific details will be described below.

The hardware configuration of the memory system 2 of the second embodiment is the same as that of a memory system 1 of the first embodiment, and thus, a detailed description thereof is omitted. A different part from the first embodiment will be mainly described below. An interface 10 receives a change request (which may be referred to as a "TRANS" in the following description) that includes address information by which a second memory cell to be set to a second resistance state can be identified, and that requests to set the second memory cell identified by the address information to a second resistance state, from a source (e.g., a host apparatus) external to the memory system 2.

In this example, the address information includes #address1 indicating a logical address and #address2 indicating the physical address of a word line WX of a second storage 200. As described above, since each bit line BX of the second storage 200 is pre-associated with a logical address, if #address1 indicating a logical address and #address2 indicating the physical address of a word line WX are specified, then a second memory cell arranged at an intersection of a bit line BX associated with the #address1 and the word line WX indicated by the #address2 can be identified. The number of pieces of address information included in the TRANS may be any, and may be one or may be plural.

A controller 20 receives the TRANS from the interface 10, and sends a change signal instructing to change the second memory cell to be set to a low resistance state, and the address information included in the TRANS, to a control unit 202 of the second storage 200 through a control signal line 120. The control unit 202 has the function of controlling voltages to be supplied to a word line WX and a bit line BX that are connected to the second memory cell identified by the address information (the address information included in the TRANS), such that the second memory cell is set to a low resistance state. In this example, the control unit 202 can be considered to have a function which may be referred to as a "third controller"; however, the configuration is not limited thereto and may be such that the function which may be referred to as the "third controller" is provided separately from the control unit 202.

Figure 9:
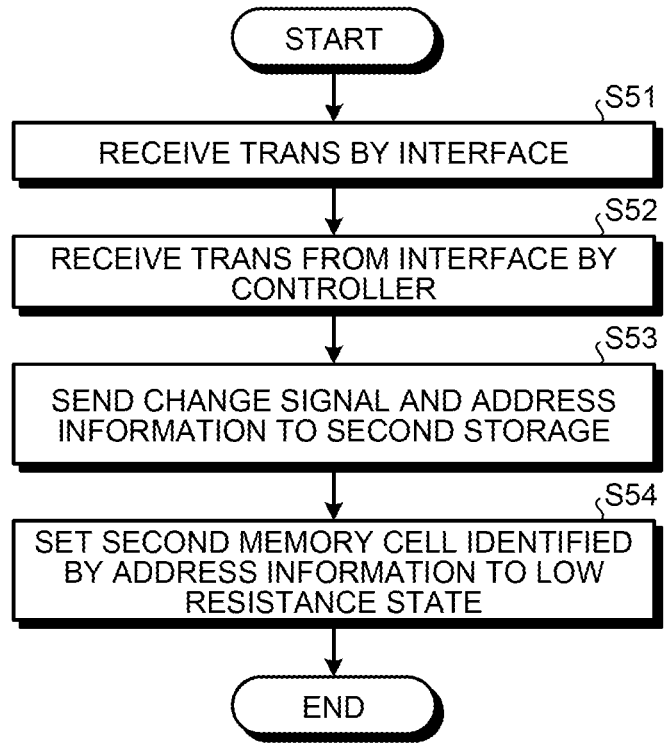
FIG. 9 is a flowchart illustrating exemplary operation of a memory system of a second embodiment.

FIG. 9 is a flowchart illustrating exemplary operation of the memory system 2 performed when, for example, a TRANS is received from the host apparatus. As illustrated in FIG. 9, first, the interface 10 receives a TRANS from the host apparatus (step S51). In order to notify of the reception of the TRANS from the host apparatus, the interface 10 may be configured to send an electrical signal to the controller 20, or may be configured to update a value in a register that is read or written directly by the controller 20.

Then, the controller 20 obtains the TRANS from the interface 10 (step S52). Then, the controller 20 sends to the second storage 200 a change signal instructing to change a second memory cell to be set to a low resistance state, and address information included in the TRANS (step S53). The control unit 202 of the second storage 200 receives a pair of the change signal and the address information from the controller 20 through the control signal line 120.

Then, the control unit 202 controls voltages to be supplied to a word line WX and a bit line BX that are connected to a second memory cell identified by the address information received from the controller 20, such that the second memory cell is set to a low resistance state (step S54). More specifically, the control unit 202 sends #address1 (logical address) included in the address information to an address converter 203, and instructs a voltage generator circuit which is not illustrated, to generate a predetermined voltage (which may be hereinafter referred to as a "third voltage") to be supplied to the bit line BX so as to set the second memory cell to a low resistance state. The address converter 203 to which the #address1 has been provided from the control unit 202 decodes the #address1 and selects a corresponding bit line BX based on the result of the decoding. At this time, the third voltage generated by the voltage generator circuit which is not illustrated is supplied to the bit line BX selected by the address converter 203. In addition, the control unit 202 controls a word line driver 204 such that a predetermined voltage (which may be hereinafter referred to as a "fourth voltage") to be supplied to a word line WX so as to set the second memory cell to a low resistance state is supplied to a word line WX indicated by #address2 (physical address) included in the address information.

Figure 10:
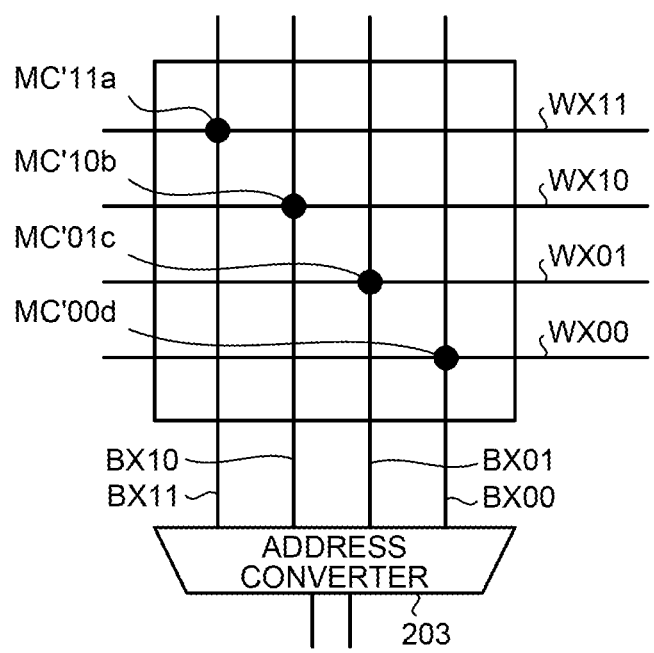
FIG. 10 is a diagram illustrating an initial state of a memory cell array of a second storage of the second embodiment.

Description is made below using a specific example. For example, the case is assumed in which as an initial state of the resistance state of each of a plurality of second memory cells included in a memory cell array 201, as illustrated in FIG. 10, of a plurality of second memory cells arranged in a matrix form at intersections of four word lines WX (WX00 to WX11) and four bit lines BX (BX00 to BX11), each of a second memory cell MC'11a arranged at an intersection of the word line WX11 and the bit line BX11, a second memory cell MC'10b arranged at an intersection of the word line WX10 and the bit line BX10, a second memory cell MC'01c arranged at an intersection of the word line WX01 and the bit line BX01, and a second memory cell MC'00d arranged at an intersection of the word line WX00 and the bit line BX00 is set to a low resistance state, and other second memory cells are set to a high resistance state. The initial states can also be represented by a matrix such as, for example, the following Equation (1):

$$\text{INITIAL STATE} = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \quad (1)$$

Now, the case is assumed in which the TRANS requests to set a second memory cell MC'01b arranged at an intersection of the word line WX10 and the bit line BX01 to a low resistance state. In this case, the TRANS includes address information including #address1 indicating a logical address associated with the bit line BX01, and #address2 indicating the physical address of the word line WX10. In this example, the case of making a change such that each of logical addresses always corresponds to one of the word lines WL of a first storage 100 is described as an example. In addition, here, it is assumed that the control unit 202 grasps the resistance states of the respective second memory cells obtained before issuing the TRANS (before a change). For example, the control unit 202 may be configured to identify a second memory cell set to a low resistance state before a change, by controlling applying a predetermined voltage to a bit line BX associated with a logical address included in address information, and detecting which word line WX an electrical signal is outputted from.

Figure 11:
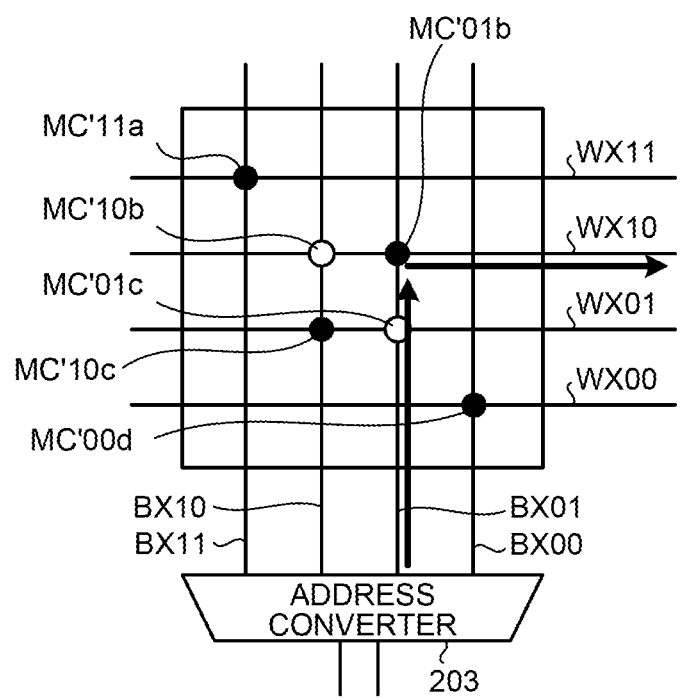
FIG. 11 is a diagram illustrating the resistance states of the memory cell array after a change in the second embodiment.

As illustrated in FIG. 11, the control unit 202 controls voltages to be supplied to the bit line BX01 and the word line WX10, such that the second memory cell MC'01b arranged at an intersection of the bit line BX01 associated with the #address1 included in the address information and the word line WX10 indicated by the #address2 included in the address information is set to a low resistance state. Subsequently, the control unit 202 controls voltages to be supplied to the bit line BX01 and the word line WX01, such that the second memory cell MC'01c which is arranged at an intersection of the bit line BX01 associated with the #address1 and the word line WX01 and which is set to a low resistance state in an initial state (before a change) is set to a high resistance state.

In addition, in this example, the second memory cell MC'01b arranged at an intersection of the word line WX10 and the bit line BX01 is newly added as a second memory cell in a low resistance state associated with (connected to) the word line WX10. Thus, in order to allow each of logical addresses to correspond to one of the word lines WL of the first storage 100, the control unit 202 controls the second memory cell MC'01b which is arranged at an intersection of the word line WX10 and the bit line BX10 and which is set to a low resistance state before a change, to be changed to a high resistance state. In addition, the control unit 202 controls a second memory cell MC'10c which is arranged at an intersection of the word line WX01 where conflicts with other logical addresses do not occur and the bit line BX10 and which is set to a high resistance state before a change, to be changed to a low resistance state. The resistance state of each of the second memory cells after the change can be represented by a matrix such as, for example, the following Equation (2):

$$\text{RESISTANCE STATE AFTER CHANGE} = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \quad (2)$$

Note that, in this example, the case in which the address information included in the TRANS is only the address information of the second memory cell MC'01b and the control unit 202 changes the resistance states of other second memory cells so as to avoid conflicts on a word line WX is described as an example; however, the configuration is not limited thereto and may be such that, for example, avoidance of conflicts on a word line WX is also considered beforehand and the address information of all of those second memory cells to be set to a low resistance state (in the example of FIG. 11, the address information of each of MC'11a, MC'10c, MC'01b, and MC'00d) is included in a TRANS. In this configuration, while the control unit 202 controls setting of second memory cells identified by address information to a low resistance state, the control unit 202 controls setting of other second memory cells to a high resistance state.

Figure 12:
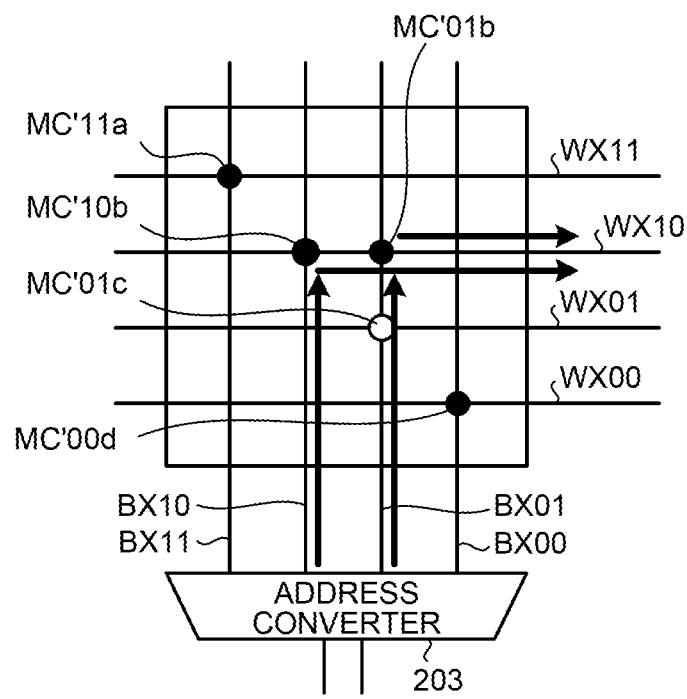
FIG. 12 is a diagram illustrating the resistance states of the memory cell array after a change in the second embodiment.

In addition, the configuration is not limited to the one in which each of logical addresses always corresponds to the word lines WL of the first storage 100. The configuration may be such that, for example, selection of the same word line WL is allowed even if logical addresses are different. In such a configuration, the case is assumed in which, as described above, a request is made to set the second memory cell MC'01b arranged at an intersection of the word line WX10 and the bit line BX01 to a low resistance state. In this case, for example, as illustrated in FIG. 12, the control unit 202 controls the second memory cell MC'10b requested to be set to a low resistance state, to be changed to a low resistance state and controls the second memory cell MC'01c which is arranged at an intersection of the bit line BX01 associated with #address1 (logical address) included in address information and the word line WX01 and which is set to a low resistance state before a change, to be changed to a high resistance state; however, since logical address conflicts on the word line WX10 are allowed, the control unit 202 does not need to perform control to change the second memory cell MC'10b which is arranged at an intersection of the word line WX10 and the bit line BX10 and which is set to a low resistance state before a change, to a high resistance state.

Figure 13:
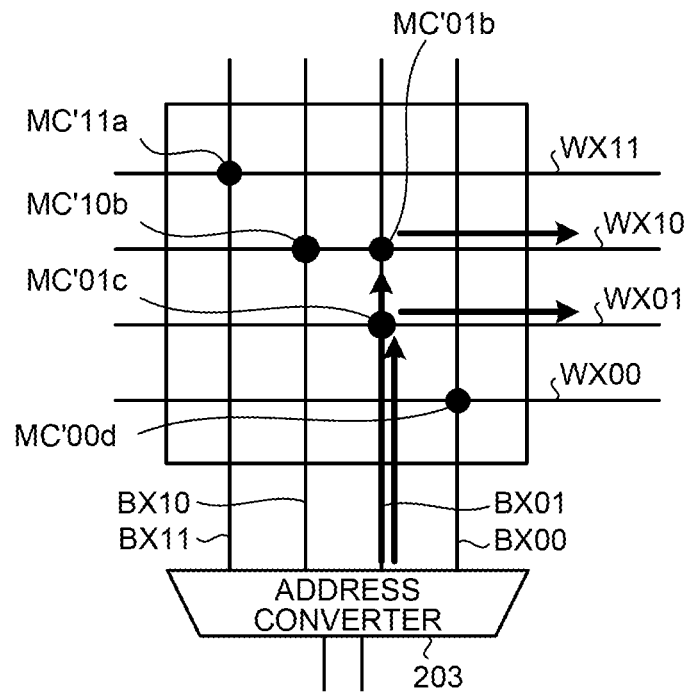
FIG. 13 is a diagram illustrating the resistance states of the memory cell array after a change in the second embodiment.

Furthermore, the configuration may be such that, for example, two or more word lines WL are selected with one logical address. In such a configuration, the case is assumed in which, as described above, a request is made to set the second memory cell MC'01b arranged at an intersection of the word line WX10 and the bit line BX01 to a low resistance state. In this case, for example, as illustrated in FIG. 13, the control unit 202 controls the second memory cell MC'01b requested to be set to a low resistance state, to be changed to a low resistance state; however, the control unit 202 does not need to perform control to change the second memory cell MC'01c which is arranged at an intersection of the bit line BX01 associated with #address1 (logical address) included in address information and the word line WX01 and which is set to a low resistance state before a change, to a high resistance state. The resistance state of each of the second memory cells after the change can be represented by a matrix such as, for example, the following Equation (3):

$$\text{RESISTANCE STATE AFTER CHANGE} = \begin{bmatrix} 1 & 0 & 0 & 0 \\ 0 & 1 & 1 & 0 \\ 0 & 0 & 1 & 0 \\ 0 & 0 & 0 & 1 \end{bmatrix} \quad (3)$$

In one-to-one L2P conversion in a conventional type memory system, for example, for data where associations are established such that A→B and B→C, an L2P table needs to be referred to twice. However, by allowing logical addresses and the word lines WL of the first storage 100 to have a one-to-multiple correspondence in the above-described manner, A→B and A→C can be simultaneously referred to. Since A→C can be prepared by outguessing data using the above-described technique, the effective read speed is further increased. For example, if a single L2P process requires 50 microseconds and reading of data from the first storage requires 100 microseconds in a conventional memory system, then reading A→B and B→C requires 300 microseconds. In the above-described example, reading may be performed by shortening such as A→C. Thus, the time required in that case is 150 microseconds, enabling to reduce the processing time by half.

As described above, a memory system capable of performing L2P conversion without using a CPU by establishing an association between the second storage 200 and the first storage 100 by a matrix can be implemented. By establishing the association by the matrix, a one-to-multiple information management association can also be established or the numerical values of the matrix can also be used to weight information. That is, flexibility in storage organization increases, enabling to increase the speed of processes. Furthermore, since an association storage function can also be added, it leads to a substantial improvement in speed.

Although the embodiments of the present invention are described above, the above-described embodiments are presented as examples and are not intended to limit the scope of the invention. These novel embodiments can be implemented by other various configurations, and various omissions, replacements, and changes may be made without departing from the spirit and scope of the invention.

Modifications

Modifications are described below. The following variants can also be arbitrarily combined together. In addition, the following variants can also be arbitrarily combined with the above-described embodiments.

(1) First Modification

The second memory cells may be configured to transition between three or more resistance states. For example, the second memory cells may be configured to be allowed to transition to a second low resistance state where the resistance value is lower than that in a low resistance state, in addition to the above-described low resistance state and high resistance state. In a word, the configuration may be any as long as the resistance states of the second memory cells are set to at least a first resistance state or a second resistance state where the resistance value is lower than that in the first resistance state.

Figure 14:
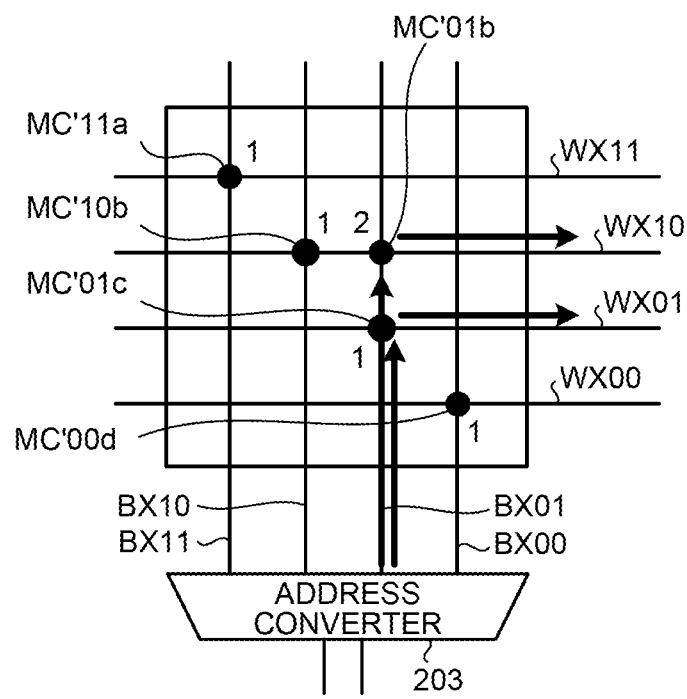
FIG. 14 is a diagram illustrating the resistance states of a memory array in a variant.

For example, in FIG. 14, it is assumed that "1" shown adjacent to a second memory cell indicates the above-described low resistance state, and "2" indicates the above-described second low resistance state. For example, when a predetermined voltage is supplied to a bit line BX01, since a second memory cell MC'01c arranged at an intersection of the bit line BX01 and a word line WX01 is set to a low resistance state, a current flows in a direction from the bit line BX01 to the word line WX01. In addition, since a second memory cell MC'01b arranged at an intersection of the bit line BX01 and a word line WX10 is set to a second low resistance state, a current also flows in a direction from the bit line BX01 to the word line WX10; however, in this case, more current flows toward the second memory cell MC'01b with a lower resistance value. Thus, a signal is more easily transmitted to a word line WL of the first storage 100 connected to the word line WX10, compared to a word line WL of the first storage 100 connected to the word line WX01.

Hence, for example, when the correspondence relationship between a logical address associated with the bit line BX01 and a word line WL of the first storage 100 connected to the word line WX10 has a high level of importance, it is preferred that, as illustrated in FIG. 14, the resistance state of the second memory cell MC'01b arranged at an intersection of the bit line BX01 and the word line WX10 be preset to a second low resistance state. That is, weights according to the level of importance are individually assigned to a correspondence relationship between logical addresses and the word lines WL of the first storage 100, and the resistance states of corresponding second memory cells can be set to multiple levels according to the weights.

(2) Second Modification

Figure 15:
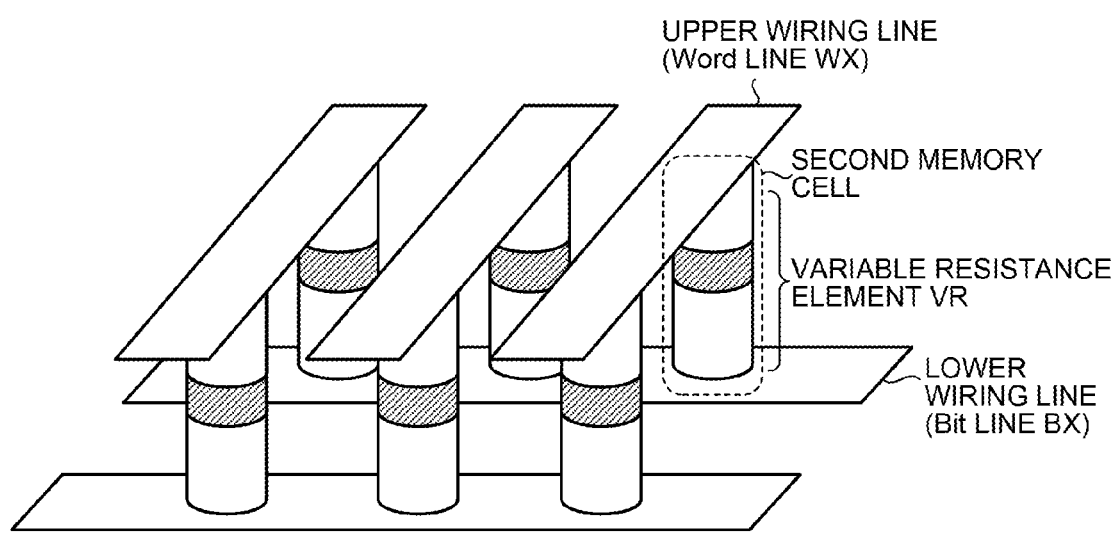
FIG. 15 is a diagram illustrating a specific structure of a memory array of a second storage of a variant.

In the example of FIG. 5, a second memory cell is configured to include a variable resistance element VR and a diode (rectifier element) D which are connected in series with each other; however, depending on the type of a resistance change film included in the variable resistance element VR, the resistance change film itself may exhibit a diode effect. In such a case, as illustrated in FIG. 15, a second memory cell may be configured to not include a diode D.

(3) Third Modification

Figure 16A:
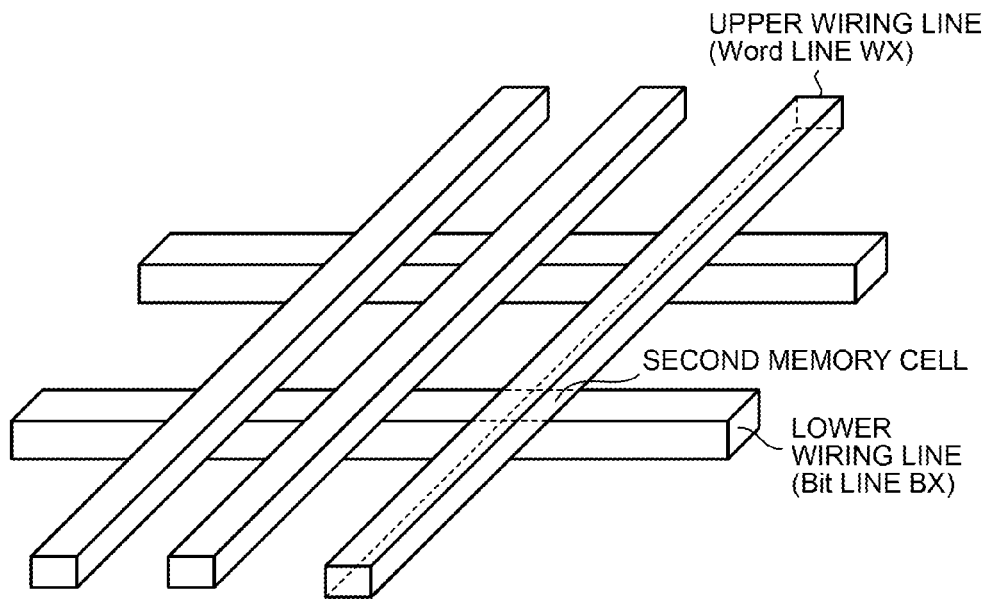
FIGS. 16A and 16B are diagrams illustrating a specific structure of a memory array of a second storage of a variant.
Figure 16B:
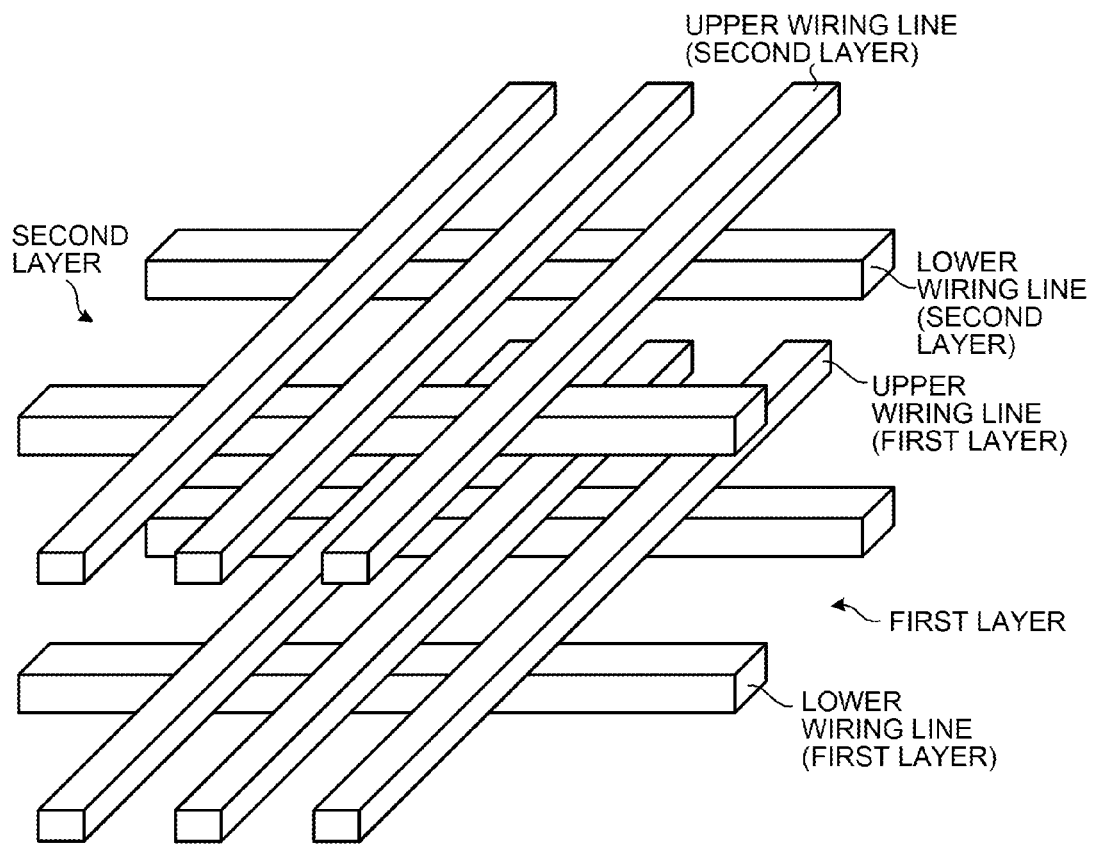

In addition, the configuration may be such that, for example, as illustrated in FIG. 16A, a variable resistance element VR (second memory cell) is formed at an interface where an upper wiring line and a lower wiring line intersect each other. In this case, wiring lines can be created with a minimum feature size, and when a feature size F is used, the size of one second memory cell can be created with a smallest size of $4F^2$. In addition, it is convenient to create in a multilayered manner, as illustrated in FIG. 16B.

(4) Fourth Modification

Figure 17:
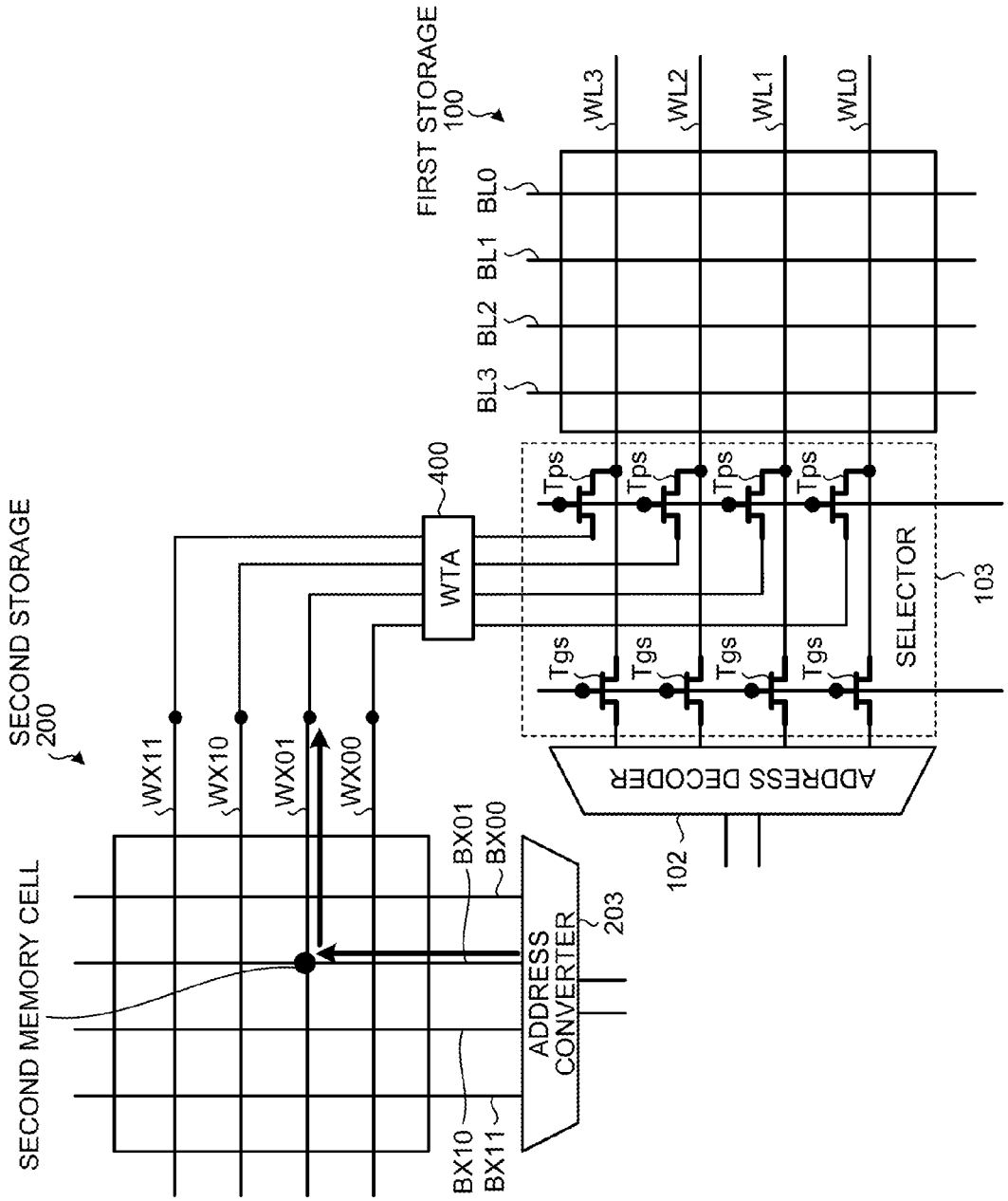
FIG. 17 is a diagram illustrating a connection relationship between a first storage and a second storage of a variant.

The configuration may be such that, for example, as illustrated in FIG. 17, there is provided a WTA (Winner-Take-All) circuit 400 that controls supply of a signal only with the highest strength among signals outputted from a plurality of word lines BX of a second storage 200, to a corresponding word line of a first storage 100. For example, while the WTA circuit 400 controls supply of an output voltage from a word line BX whose output voltage indicates its maximum value, to a corresponding pass transistor Tps and word line, the WTA circuit 400 can perform control such that, for a word line BX whose output voltage indicates a value other than the maximum value, an output voltage supplied to a corresponding pass transistor Tps and word line is 0 V. In this example, the WTA circuit 400 which may be referred to as a "fifth controller".

(5) Fifth Modification

Figure 18:
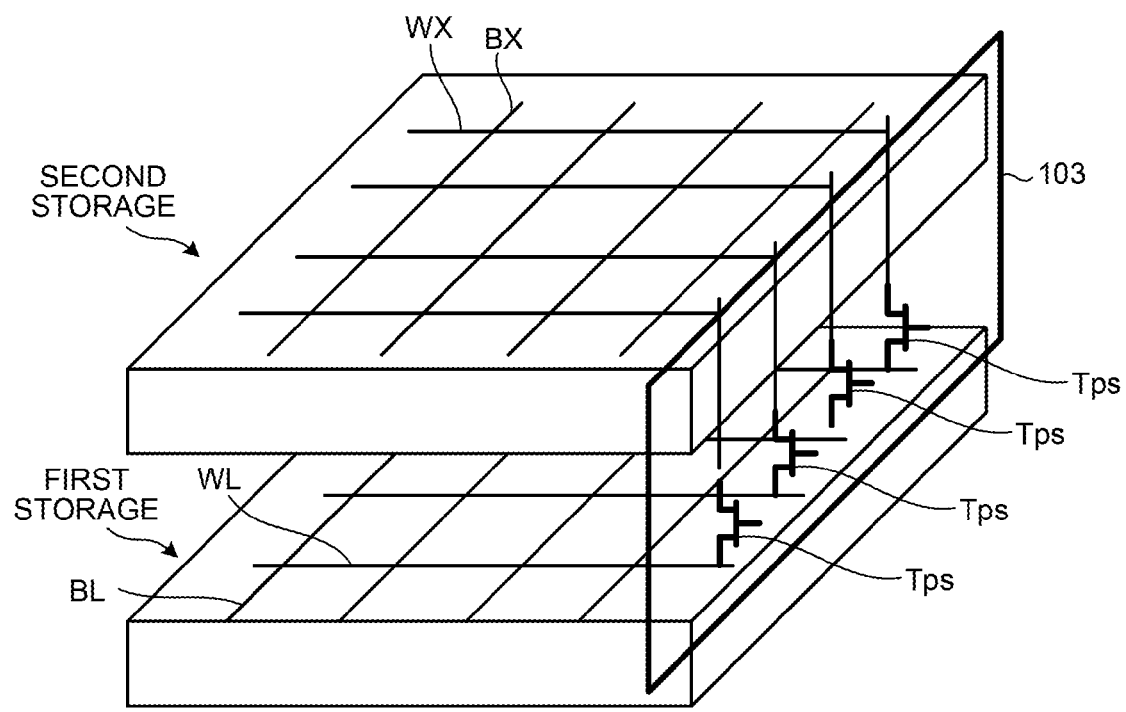
FIG. 18 is a diagram illustrating an arrangement relationship between a first storage and a second storage of a variant.

The configuration may be such that, for example, as illustrated in FIG. 18, a second storage 200 is arranged so as to be stacked with a first storage 100. By adopting such a vertical stack configuration, flexibility in design layout can be improved. In the example of FIG. 18, pass transistors Tps are provided between the first storage 100 and the second storage 200.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory system comprising:
a plurality of first wiring lines;
a plurality of second wiring lines;
a first storage including a plurality of first memory cells arranged at intersections of the plurality of first wiring lines and the plurality of second wiring lines;
a plurality of third wiring lines, each connected to any one of the plurality of first wiring lines;
a plurality of fourth wiring lines, each pre-associated with a logical address specified by a host apparatus; and
a second storage including a plurality of second memory cells arranged at intersections of the plurality of third wiring lines and the plurality of fourth wiring lines, a resistance state of each of the second memory cells being set to at least a first resistance state or a second resistance state where a resistance value is lower than that in the first resistance state, according to a correspondence relationship between the logical address and a first wiring line,
wherein a NAND flash memory is used as the first storage.

2. The memory system according to claim 1, further comprising a first controller configured to control supply of a first voltage to a fourth wiring line associated with a logical address included in a read request for requesting reading of data from the first storage, such that a read voltage for reading the data is supplied to a first wiring line associated with a second memory cell in the second resistance state connected to the fourth wiring line associated with the logical address, the read request being sent from the host apparatus.

3. The memory system according to claim 1, further comprising a second controller configured to control supply of a second voltage to a fourth wiring line associated with a logical address included in a write request for requesting writing of data into the first storage, such that a write voltage for writing the data is supplied to a first wiring line associated with a second memory cell in the second resistance state connected to the fourth wiring line associated with the logical address, the write request being sent from the host apparatus.

4. The memory system according to claim 1, further comprising a third controller configured to control voltages to be supplied to a third wiring line and a fourth wiring line, such that a second memory cell identified by address information for identifying a second memory cell to be set to the second resistance state is set to the second resistance state, the address information being included in a change request for requesting setting the second memory cell identified by the address information to the second resistance state, and the third wiring line and the fourth wiring line being connected to the second memory cell.

5. The memory system according to claim 1, wherein the correspondence relationship represents a correspondence between a corresponding logical address and a corresponding first wiring line to which a read voltage for reading data based on the logical address or a write voltage for writing the data is supplied upon reading or writing the data.

6. The memory system according to claim 1, further comprising a plurality of switching elements, each corresponding to one of the plurality of fourth wiring lines, each of the switching elements switching to establish a connection between a corresponding fourth wiring line and a corresponding first wiring line.

7. The memory system according to claim 6, further comprising a fourth controller configured to allow the plurality of switching elements to transition to an ON state when data is read or written from/into the first storage based on a logical address specified by the host apparatus.

8. The memory system according to claim 1, further comprising a fifth controller configured to control supply of a signal only with a highest strength among signals outputted from the plurality of third wiring lines, to a corresponding first wiring line.

9. The memory system according to claim 1, wherein the second storage is arranged so as to be stacked with the first storage.

10. The memory system according to claim 9, further comprising a plurality of switching elements, each corresponding to one of the plurality of fourth wiring lines, each of the switching elements switching to establish a connection between a corresponding fourth wiring line and a corresponding first wiring line, wherein
the switching elements include transistors provided between the first storage and the second storage.

11. The memory system according to claim 1, wherein each of the second memory cells includes a variable resistance element sandwiched between a corresponding third wiring line and a corresponding fourth wiring line.

12. The memory system according to claim 1, wherein each of the first memory cells is a memory cell capable of storing information of at least two or more values, according to an amount of charge accumulated in a floating gate electrode.

13. The memory system according to claim 1, wherein
when data is read or written on the basis of the logical address, the resistance state of a second memory cell corresponding to an intersection of a fourth wiring line associated with the logical address and a third wiring line connected to a first wiring line associated with the logical address is preset to the second resistance state.

14. The memory system according to claim 1, wherein the number of the first wiring lines associated with one logical address is two or more.

15. The memory system according to claim 2, further comprising an address converter configured to decode the logical address and select a corresponding fourth wiring line on the basis of a result of the decoding, wherein
the first controller sends the logical address included in the read request to the address converter and instructs a voltage generator circuit to generate the first voltage.

16. The memory system according to claim 3, further comprising an address converter configured to decode the logical address and select a corresponding fourth wiring line on the basis of a result of the decoding, wherein
the second controller sends the logical address included in the write request to the address converter and instructs a voltage generator circuit to generate the second voltage.

17. The memory system according to claim 11, wherein the resistance state of each of the second memory cells is set to at least the first resistance state or the second resistance state according to voltages applied to a corresponding third wiring line and a corresponding fourth wiring line that are connected to the second memory cell.

18. The memory system according to claim 1, wherein the second storage has a smaller storage capacity than the first storage.

19. The memory system according to claim 1, wherein an ReRAM is used as the second storage.

\* \* \* \* \*